United States Patent
Birang et al.

(10) Patent No.: US 6,876,454 B1
(45) Date of Patent: *Apr. 5, 2005

(54) APPARATUS AND METHOD FOR IN-SITU ENDPOINT DETECTION FOR CHEMICAL MECHANICAL POLISHING OPERATIONS

(75) Inventors: Manoocher Birang, Los Gatos, CA (US); Nils Johansson, Los Gatos, CA (US); Allan Gleason, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/399,310

(22) Filed: Sep. 20, 1999

Related U.S. Application Data

(63) Continuation of application No. 08/979,015, filed on Nov. 26, 1997, now abandoned, which is a continuation of application No. 08/413,982, filed on Mar. 28, 1995, now abandoned.

(51) Int. Cl.[7] ............................ G01B 9/02; G01B 11/28; B24B 49/00
(52) U.S. Cl. ............................ 356/503; 356/630; 451/6
(58) Field of Search ................................ 356/503, 504, 356/630; 451/6

(56) References Cited

U.S. PATENT DOCUMENTS

| | | |
|---|---|---|
| 4,680,369 A | 7/1987 | Kajimoto et al. |
| 4,927,485 A | 5/1990 | Cheng et al. |
| 5,081,796 A | 1/1992 | Schultz |
| 5,196,353 A | 3/1993 | Sandhu et al. |
| 5,257,478 A | 11/1993 | Hyde et al. |

(Continued)

FOREIGN PATENT DOCUMENTS

| | | |
|---|---|---|
| EP | 0663265 | 3/1998 |
| FR | A-1 075 634 | 10/1954 |
| JP | 57-138575 | 8/1982 |
| JP | 58-004353 | 1/1983 |
| JP | 58-178526 | 10/1983 |

(Continued)

OTHER PUBLICATIONS

Hench, "In situ real–time ellipsometry for film thickness measurement and control," J. Vac. Sci. Technol. A. vol. 10, No. 4:934–938 (Jul./Aug. 1992).

Sautter, et al., "Development Process Control and Optimization Utilizing an End Point Monitor," SPIE vol. 1087:312–321 (1989).

Jurczyk, et al., "Process Detection System," IBM Technical Disclosure Bulletin, vol. 18 No. 6:1867–1870 (Nov. 1975).

Anonymous, "End–Point Detection of Oxide Polishing and Planarization of Semiconductor Devices," Research Disclosure, No. 340 (Aug. 1992).

Rodel, "Wafer Mounting Assemblies and Materials", ®1992 Rodel, Scottsdale, Arizona.

(Continued)

*Primary Examiner*—Gregory J. Toatley, Jr.
*Assistant Examiner*—Patrick Connolly
(74) *Attorney, Agent, or Firm*—Fish & Richardson

(57) ABSTRACT

An apparatus and method of chemical mechanical polishing (CMP) of a wafer employing a device for determining, in-situ, during the CMP process, an endpoint where the process is to be terminated. This device includes a laser interferometer capable of generating a laser beam directed towards the wafer and detecting light reflected from the wafer, and a window disposed adjacent to a hole formed through a platen. The window provides a pathway for the laser beam during at least part of the time the wafer overlies the window.

76 Claims, 12 Drawing Sheets

U.S. PATENT DOCUMENTS

| | | |
|---|---|---|
| 5,413,941 A | 5/1995 | Koos et al. |
| 5,433,651 A | 7/1995 | Lustig et al. |
| 5,486,129 A | 1/1996 | Sandhu et al. |
| 5,489,233 A | 2/1996 | Cook et al. |
| 5,499,733 A | 3/1996 | Litvak |
| 5,605,760 A | 2/1997 | Roberts |
| 5,609,511 A | 3/1997 | Moriyama et al. |
| 5,672,091 A | 9/1997 | Takahashi et al. |
| 5,766,755 A | 6/1998 | Chaussade et al. |
| 5,893,796 A * | 4/1999 | Birang et al. ............... 451/526 |
| 5,946,927 A | 9/1999 | Dieckmann et al. |
| 5,949,927 A * | 9/1999 | Tang |
| 5,964,643 A * | 10/1999 | Birang et al. ................. 451/6 |
| 6,045,439 A * | 4/2000 | Birang et al. ............... 451/526 |
| 6,248,000 B1 | 6/2001 | Aiyer |
| 6,280,290 B1 * | 8/2001 | Birang et al. ................. 451/6 |
| 6,383,058 B1 * | 5/2002 | Birang et al. ................ 451/41 |
| 6,524,164 B1 | 2/2003 | Tolles |
| 6,537,133 B1 * | 3/2003 | Birang et al. ................. 451/6 |
| 6,614,529 B1 * | 9/2003 | Tang .......................... 356/630 |
| 6,676,717 B1 * | 1/2004 | Birang et al. ................ 51/296 |
| 6,719,818 B1 * | 4/2004 | Birang et al. ................ 51/296 |
| 2003/0114076 A1 | 6/2003 | Chang et al. |

FOREIGN PATENT DOCUMENTS

| | | |
|---|---|---|
| JP | 61-270060 | 11/1986 |
| JP | 62-190728 | 8/1987 |
| JP | 62-211927 | 9/1987 |
| JP | 02-86128 | 7/1990 |
| JP | 02-222533 | 9/1990 |
| JP | 3-234467 | 10/1991 |
| JP | 03-268241 | 11/1991 |
| JP | 5-138531 | 6/1993 |
| JP | 05-309558 | 11/1993 |
| JP | 60-037076 | 2/1994 |
| JP | 07-52032 | 2/1995 |
| WO | WO 93/20976 | 10/1993 |

OTHER PUBLICATIONS

Carotta, et al., "Effect of Thickness and Surface Treatment on Silicon Water Reflectance," Solar Energy Materials and Solar Cells 27: 265–272 (1992).

Rodel, "Glass Polishing Pads", Jan 1993, Scottsdale, Arizona.

* cited by examiner

APPARATUS AND METHOD FOR IN-SITU ENDPOINT DETECTION FOR CHEMICAL MECHANICAL POLISHING OPERATIONS

This application is a continuation (and claims the benefit of priority under 35 USC 120) of U.S. application Ser. No. 08/979,015, filed Nov. 26, 1997 now abandoned, which is a file wrapper continuation of U.S. application Ser. No. 08/413,982, filed Mar. 28, 1995 now abandoned.

BACKGROUND

1. Technical Field

This invention relates to semiconductor manufacture, and more particularly, to an apparatus and method for chemical mechanical polishing (CMP) and in-situ endpoint detection during the CMP process.

2. Background Art a In the process of fabricating modem semiconductor integrated circuits (ICs), it is necessary to form various material layers and structures over previously formed layers and structures. However, the prior formations often leave the top surface topography of an in-process wafer highly irregular, with bumps, areas of unequal elevation, troughs, trenches, and/or other surface irregularities. These irregularities cause problems when forming the next layer. For example, when printing a photolithographic pattern having small geometries over previously formed layers, a very shallow depth of focus is required. Accordingly, it becomes essential to have a flat and planar surface, otherwise, some parts of the pattern will be in focus and other parts will not. In fact, surface variations on the order of less than 1000 Å over a 25×25 mm die would be preferable. In addition, if the aforementioned irregularities are not leveled at each major processing step, the surface topography of the wafer can become even more irregular, causing further problems as the layers stack up during further processing. Depending on the die type and the size of the geometries involved, the aforementioned surface irregularities can lead to poor yield and device performance. Consequently, it is desirable to effect some type of planarization, or leveling, of the IC structures. In fact, most high density IC fabrication techniques make use of some method to form a planarized wafer surface at critical points in the manufacturing process.

One method for achieving the aforementioned semiconductor wafer planarization or topography removal is the chemical mechanical polishing (CMP) process. In general, the chemical mechanical polishing (CMP) process involves holding and/or rotating the wafer against a rotating polishing platen under a controlled pressure. As shown in FIG. 1, a typical CMP apparatus 10 includes a polishing head 12 for holding the semiconductor wafer 14 against the polishing platen 16. The aforementioned polishing platen 16 is typically covered with a pad 18. This pad 18 typically has a backing layer 20 which interfaces with the surface of the platen and a covering layer 22 which is used in conjunction with a chemical polishing slurry to polish the wafer 14. Although some pads 18 have only the covering layer 22, and no backing layer. The covering layer 22 is usually either an open cell foamed polyurethane (e.g. Rodel IC1000), or a sheet of polyurethane with a grooved surface (e.g. Rodel EX2000). The pad material is wetted with the aforementioned chemical polishing slurry containing both an abrasive and chemicals. One typical chemical slurry includes KOH (Potassium Hydroxide) and fumed-silica particles. The platen is usually rotated about its central axis 24. In addition, the polishing head is usually rotated about its central axis 26, and translated across the surface of the platen 16 via a translation arm 28. Although just one polishing head is shown in FIG. 1, CMP devices typically have more than one of these heads spaced circumferentially around the polishing platen.

A particular problem encountered during a CMP process is in the determination that a part has been planarized to a desired flatness or relative thickness. In general, there is a need to detect when the desired surface characteristics or planar condition has been reached. This has been accomplished in a variety of ways. Early on, it was not possible to monitor the characteristics of the wafer during the CMP process. Typically, the wafer was removed from the CMP apparatus and examined elsewhere. If the wafer did not meet the desired specifications, it had to be reloaded into the CMP apparatus and reprocessed. This was a time consuming and labor-intensive procedure. Alternately, the examination might have revealed that an excess amount of material had been removed, rendering the part unusable. There was, therefore, a need in the art for a device which could detect when the desired surface characteristics or thickness had been achieved, in-situ, during the CMP process.

Several devices and methods have been developed for the in-situ detection of endpoints during the CMP process. For instance, devices and methods that are associated with the use of ultrasonic sound waves, and with the detection of changes in mechanical resistance, electrical impedance, or wafer surface temperature, have been employed. These devices and methods rely on determining the thickness of the wafer or a layer thereof, and establishing a process endpoint, by monitoring the change in thickness. In the case where the surface layer of the wafer is being thinned, the change in thickness is used to determine when the surface layer has the desired depth. And, in the case of planarizing a patterned wafer with an irregular surface, the endpoint is determined by monitoring the change in thickness and knowing the approximate depth of the surface irregularities. When the change in thickness equals the depth of the irregularities, the CMP process is terminated. Although these devices and methods work reasonably well for the applications for which they were intended, there is still a need for systems which provide a more accurate determination of the endpoint.

SUMMARY

The present invention is directed to a novel apparatus and method for endpoint detection which can provide this improved accuracy. The apparatus and method of the present invention employ interferometric techniques for the in-situ determination of the thickness of material removed or planarity of a wafer surface, during the CMP process.

Specifically, the foregoing objective is attained by an apparatus and method of chemical mechanical polishing (CMP) employing a rotatable polishing platen with an overlying polishing pad, a rotatable polishing head for holding the wafer against the polishing pad, and an endpoint detector. The polishing pad has a backing layer which interfaces with the platen and a covering layer which is wetted with a chemical slurry and interfaces with the wafer. The wafer is constructed of a semiconductor substrate underlying an oxide layer. And, the endpoint detector includes a laser interferometer capable of generating a laser beam directed towards the wafer and detecting light reflected therefrom, and a window disposed adjacent to a hole formed through the platen. This window provides a pathway for the laser beam to impinge on the wafer, at least during the time that the wafer overlies the window.

The window can take several forms. Among these are an insert mounted within the platen hole. This insert is made of a material which is highly transmissive to the laser beam, such as quartz. In this configuration of the window, an upper surface of the insert protrudes above a surface of the platen and extends away from the platen a distance such that a gap is formed between the upper surface of the insert and the wafer, whenever the wafer is held against the pad. This gap is preferably made as small as possible, but without allowing the insert to touch the wafer. Alternately, the window can take the form of a portion of the polishing pad from which the adjacent backing layer has been removed. This is possible because the polyurethane covering layer is at least partially transmissive to the laser beam. Finally, the window can take the form of a plug formed in the covering layer of the pad and having no backing layer. This plug is preferably made of a polyurethane material which is highly transmissive to the laser beam.

In one embodiment of the present invention, the hole through the platen, and the window, are circular in shape. In another, the hole and window are arc-shaped. The arc-shaped window has a radius with an origin coincident to the center of rotation of the platen. Some embodiments of the invention also have a laser beam whose beam diameter that at its point of impingement on the wafer is significantly greater than the smallest diameter possible for the wavelength employed.

The aforementioned CMP apparatus can also include a position sensor for sensing when the window is adjacent the wafer. This ensures that the laser beam generated by the laser interferometer can pass unblocked through the window and impinge on the wafer. In a preferred embodiment of the invention, the sensor includes a flag attached along a portion of the periphery of the platen which extends radially outward therefrom. In addition, there is an optical interrupter-type sensor mounted to the chassis at the periphery of the platen. This sensor is capable of producing an optical beam which causes a signal to be generated for as long as the optical beam is interrupted by the flag. Thus, the flag is attached to the periphery of the platen in a position such that the optical beam is interrupted by the flag, whenever the laser beam can be made to pass unblocked through the window and impinge on the wafer.

Further, the laser interferometer includes a device for producing a detection signal whenever light reflected from the wafer is detected, and the position sensor includes an element for outputting a sensing signal whenever the window is adjacent the wafer. This allows a data acquisition device to sample the detection signal from the laser interferometer for the duration-of the sensing signal from the position sensor. The data acquisition device then employs an element for outputting a data signal representing the sampled detection signal. This data acquisition device can also include an element for integrating the sampled detection signal from the laser interferometer over a predetermined period of time, such that the output is a data signal representing the integrated samples of the detection signal. In cases where the aforementioned predetermined sample period cannot be obtained during only one revolution of the platen, an alternate method of piece-wise data acquisition can be employed. Specifically, the data acquisition device can include elements for performing the method of sampling the detection signal output from the laser interferometer during each complete revolution of the platen for a sample time, integrating each sample of the detection signal over the sample time to produce an integrated value corresponding to each sample, and storing each integrated value. The data acquisition device then uses other elements for computing a cumulative sample time after each complete revolution of the platen (where the cumulative sample time is the summation of the sample times associated with each sample of the detection signal), comparing the cumulative sample time to a desired minimum sample time, and transferring the stored integrated values from the storing element to the element for calculating a summation thereof, whenever the cumulative sample time equals or exceeds the predetermined minimum sample time. Accordingly, the aforementioned output is a data signal representing a series of the integrated value summations from the summation element.

The data signal output by the data acquisition device is cyclical due to the interference between the portion of the laser beam reflected from the surface of the oxide layer of the wafer and the portion reflected from the surface of the underlying wafer substrate, as the oxide layer is thinned during the CMP process. Accordingly, the endpoint in a CMP process to thin the oxide layer of a blank oxide wafer can be determined using additional apparatus elements for counting a number of cycles exhibited by the data signal, computing a thickness of material removed during one cycle of the output signal from the wavelength of the laser beam and the index of refraction of the oxide layer of the wafer, comparing a desired thickness of material to be removed from the oxide layer to a removed thickness comprising the product of the number of cycles exhibited by the data signal and the thickness of material removed during one cycle, and terminating the CMP whenever the removed thickness equals or exceeds the desired thickness of material to be removed. Alternately, instead of counting complete cycles, a portion of a cycle could be counted. The procedure is almost identical except that the thickness of material removed is determined for the portion of the cycle, rather than for an entire cycle.

An alternate way of determining the endpoint in a CMP processing of a blank oxide wafer uses apparatus elements which measure the time required for the data signal to complete either a prescribed number of cycles or a prescribed portion of one cycle, compute the thickness of material removed during the time measured, calculate a rate of removal by dividing the thickness of material removed by the time measured, ascertain a remaining removal thickness by subtracting the thickness of material removed from a desired thickness of material to be removed from the oxide layer, establish a remaining CMP time by dividing the remaining removal thickness by the rate of removal, and terminate the CMP process after the expiration of the remaining CMP time.

In addition, this remaining CMP time can be updated after each occurrence of the aforementioned number of cycles, or portions thereof, to compensate for any changes in the material removal rate. In this case the procedure is almost identical except that ascertaining the thickness of the material involves first summing all the thicknesses removed in earlier iteration and subtracting this cumulative thickness from the desired thickness to determine the remaining removal thickness figure.

However, when the wafer has an initially irregular surface topography and is to be planarized during the CMP process, the data signal is cyclical only after the wafer surface has become smooth. In this case an endpoint to the CMP process corresponding to a determination that the wafer has been planarized is obtained by employing addition apparatus elements for detecting a cyclic variation in the data signal, and terminating the CMP whenever the detecting element detects the cyclic variation. Preferably, the detecting element is capable of detecting a cyclical variation in the data signal within at most one cycle of the beginning of this variation.

In some circumstances, it is desirable to control the film thickness overlying a structure on a patterned wafer. This film thickness cannot always be achieved through the aforementioned planarization. However, this control can still be obtained by filtering the data signal to exclude all frequencies other than that associated with the particular structure, or group of similarly sized structures, over which a specific film thickness is desired. Essentially, once the signal has been filtered, any of the previously summarized ways of determining a CMP endpoint for a blank oxide wafer can be employed on the patterned wafer.

In addition to the just described benefits, other objectives and advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

FIGS. 11A–C are simplified cross-sectional views of a patterned wafer with an irregular surface being processed by the apparatus of FIG. 2, wherein FIG. 11A shows the wafer at the beginning of the CMP process, FIG. 11B shows the wafer about midway through the process, and FIG. 11C shows the wafer close to the point of planarization.

DETAILED DESCRIPTION OF THE PREFERRED EMBODIMENTS

Preferred embodiments of the present invention will now be described with reference to the drawings.

Figure 1:
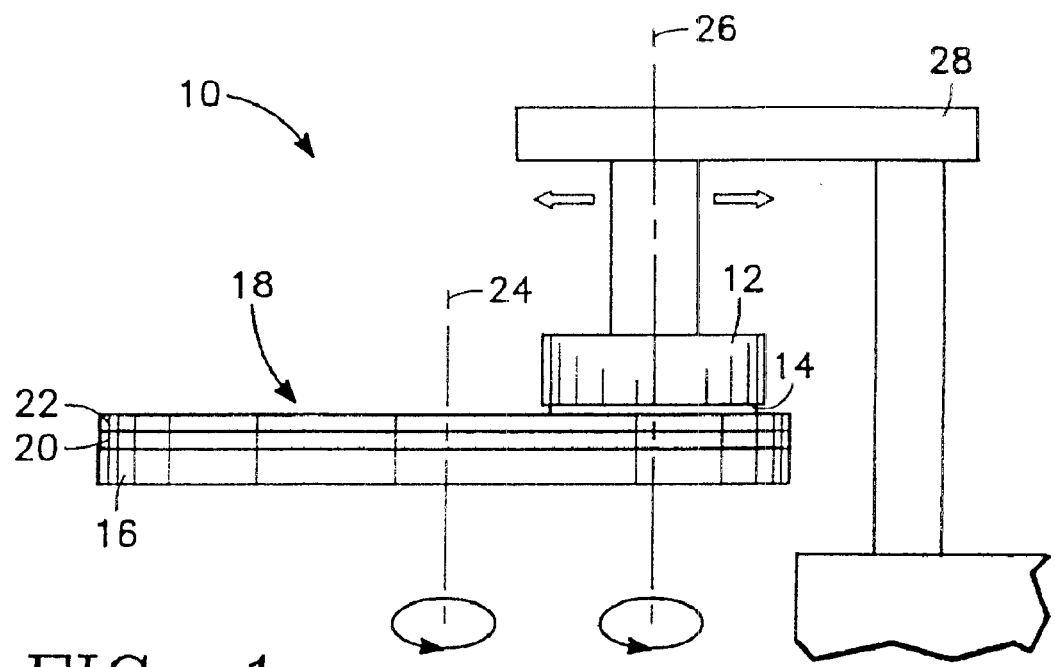
FIG. 1 is a side view of a chemical mechanical polishing (CMP) apparatus typical of the prior art.
Figure 2:
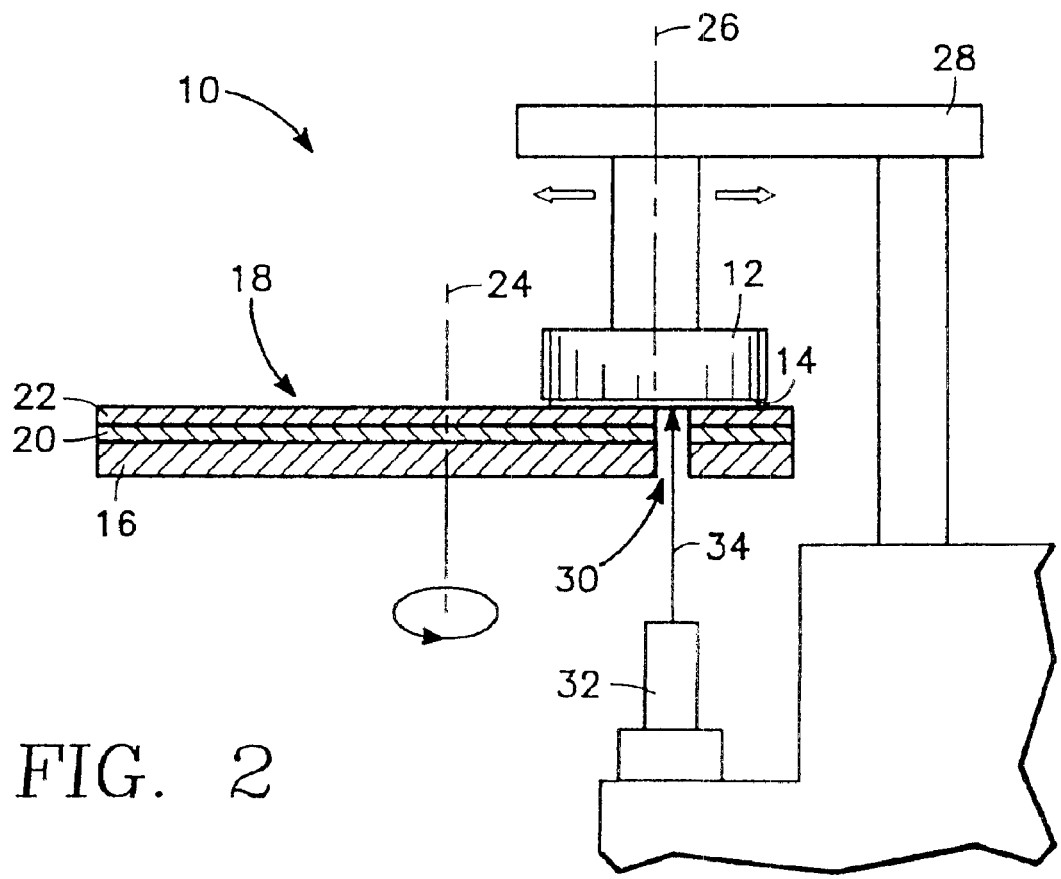
FIG. 2 is a side view of a chemical mechanical polishing apparatus with endpoint detection constructed in accordance with the present invention.

FIG. 2 depicts a portion of a CMP apparatus modified in accordance with one embodiment of the present invention. A hole 30 is formed in the platen 16 and the overlying platen pad 18. This hole 30 is positioned such that it has a view the wafer 14 held by a polishing head 12 during a portion of the platen's rotation, regardless of the translational position of the head 12. A laser interferometer 32 is fixed below the platen 16 in a position enabling a laser beam 34 projected by the laser interferometer 32 to pass through the hole 30 in the platen 16 and strike the surface of the overlying wafer 14 during a time when the hole 30 is adjacent the wafer 14.

Figures 3A, 3B, 3C:
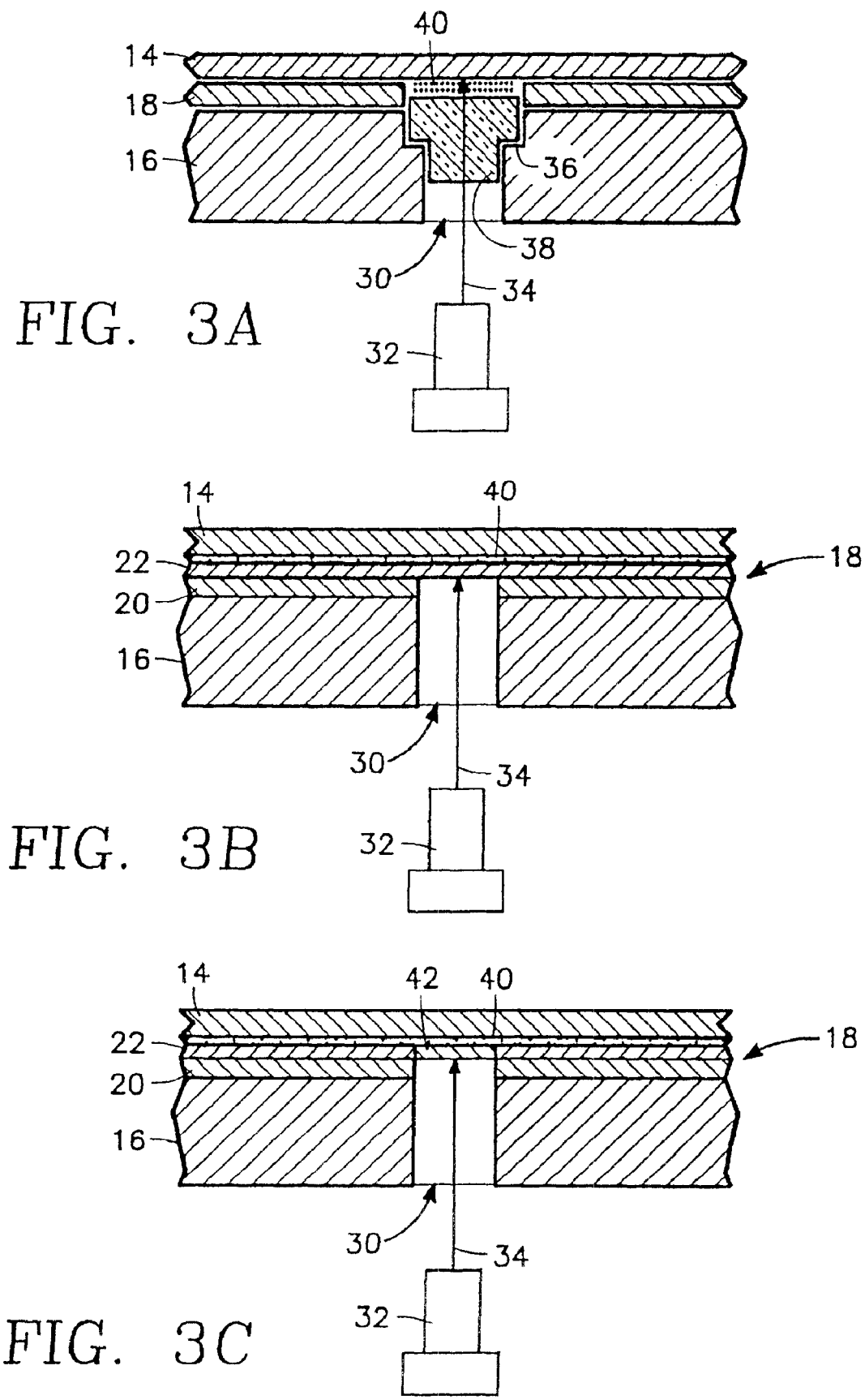
FIGS. 3A–C are simplified cross-sectional views of respective embodiments of the window portion of the apparatus of FIG. 2.

A detailed view of the platen hole S and wafer 14 (at a time when it overlies the platen hole 30) are shown in FIGS. 3A–C. As can be seen in FIG. 3A, the platen hole 30 has a stepped diameter, thus forming a shoulder 36. The shoulder 36 is used to contain and hold a quartz insert 38 which functions as a window for the laser beam 34. The interface between the platen 16 and the insert 38 is sealed, so that the portion of the chemical slurry 40 finding its way between the wafer 14 and insert 38 cannot leak through to the bottom of the platen 16. The quartz insert 38 protrudes above the top surface of the platen 16 and partially into the platen pad 18. This protrusion of the insert 38 is intended to minimize the gap between the top surface of the insert 38 and the surface of the wafer 14. By minimizing this gap, the amount of slurry 40 trapped in the gap is minimized. This is advantageous because the slurry 40 tends to scatter light traveling through it, thus attenuating the laser beam emitted from the laser interferometer 32. The thinner the layer of slurry 40 between the insert 38 and the wafer 14, the less the laser beam 34 and light reflected from the wafer, is attenuated. It is believed a gap of approximately 1 mm would result in acceptable attenuation values during the CMP process. However, it is preferable to make this gap even smaller. The gap should be made as small as possible while still ensuring the insert 38 does not touch the wafer 14 at any time during the CMP process. In a tested embodiment of the present invention, the gap between the insert 38 and wafer 14 was set at 10 mils (250 $\mu$m) with satisfactory results.

FIG. 3B shows an alternate embodiment of the platen 16 and pad 18. In this embodiment, the quartz insert has been eliminated and no through-hole exists in the pad 18. Instead, the backing layer 20 (if present) of the pad 18 has been removed in the area overlying the hole 30 in the platen 16. This leaves only the polyurethane covering layer 22 of the pad 18 between the wafer 14 and the bottom of the platen 16. It has been found that the polyurethane material used in the covering layer 22 will substantially transmit the laser beam 34 from the laser interferometer 32. Thus, the portion of the covering layer 22 which overlies the platen hole 30 functions as a window for the laser beam 34. This alternate arrangement has significant advantages. First, because the pad 18 itself is used as the window, there is no appreciable gap. Therefore, very little of the slurry 40 is present to cause the detrimental scattering of the laser beam. Another advantage of this alternate embodiment is that pad wear becomes irrelevant. In the first-described embodiment of FIG. 3A, the gap between the quartz insert 38 and the wafer 14 was made as small as possible. However, as the pad 18 wears, this gap tend to become even smaller. Eventually, the wear could become so great that the top surface of the insert 38 would touch the wafer 14 and damage it. Since the pad 18 is used as the window in the alternate embodiment of FIG. 3B, and is designed to be in contact with the wafer 14, there are no detrimental effects due to the aforementioned wearing of the pad 18. It is noted that tests using both the open-cell and grooved surface types of pads have shown that the laser beam is less attenuated with the grooved surface pad. Accordingly, it is preferable that this type of pad be employed.

Although the polyurethane material used in the covering layer of the pad is substantially transmissive to the laser beam, it does contain certain additives which inhibit its transmissiveness. This problem is eliminated in the embodiment of the invention depicted in FIG. 3C. In this embodiment, the typical pad material in the region overlying the platen hole 30 has been replaced with a solid polyurethane plug 42. This plug 42, which functions as the window for the laser beam, is made of a polyurethane material which lacks the grooving (or open-cell structure) of the surrounding pad material, and is devoid of the additives which inhibit transmissiveness. Accordingly, the attenuation of the laser beam 34 through the plug 42 is minimized. Preferably, the plug 42 is integrally molded into the pad 18.

In operation, a CMP apparatus in accordance with the present invention uses the laser beam from the laser interferometer to determine the amount of material removed from the surface of the wafer, or to determine when the surface has become planarized. The beginning of this process will be explained in reference to FIG. 4. It is noted that a laser and collimator 44, beam splitter 46, and detector 48 are depicted as elements of the laser interferometer 32. This is done to facilitate the aforementioned explanation of the operation of the CMP apparatus. In addition, the embodiment of FIG. 3A employing the quartz insert 38 as a window is shown for convenience. Of course, the depicted configuration is just one possible arrangement, others can be employed. For instance, any of the aforementioned window arrangements could be employed, and alternate embodiments of the laser interferometer 32 are possible. One alternate interferometer arrangement would use a laser to produce a beam which is incident on the surface of the wafer at an angle. In this embodiment, a detector would be positioned at a point where light reflecting from the wafer would impinge upon it. No beam splitter would be required in this alternate embodiment.

Figure 4:
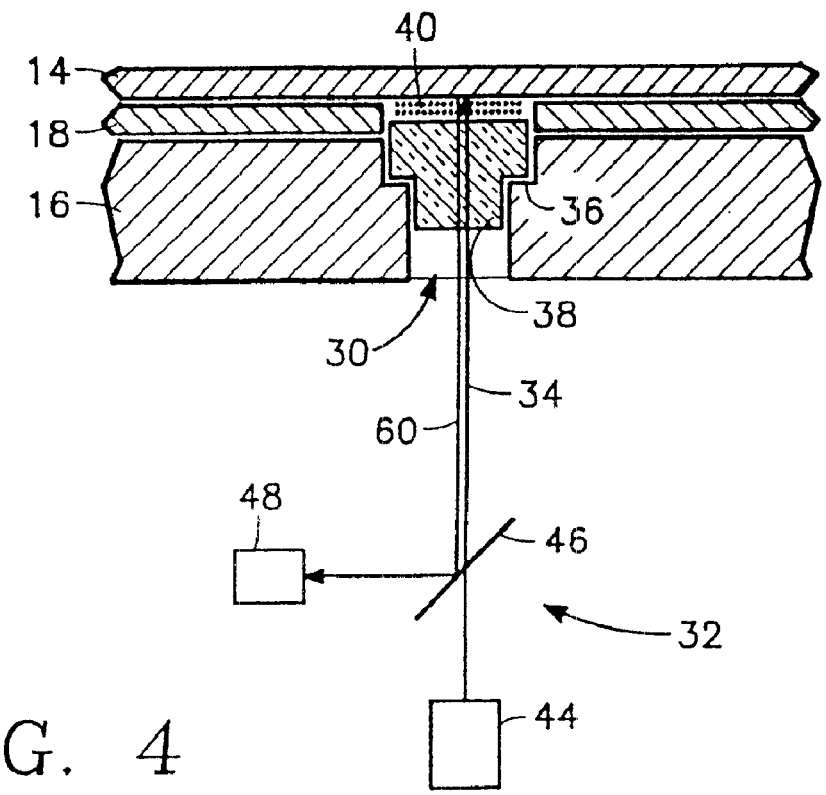
FIG. 4 is a simplified cross-sectional view of a window portion of the apparatus of FIG. 2, showing components of a laser interferometer generating a laser beam and detecting a reflected interference beam.

As illustrated in FIG. 4, the laser and collimator 44 generate a collimated laser beam 34 which is incident on the lower portion of the beam splitter 46. A portion of the beam 34 propagates through the beam splitter 46 and the quartz insert 38. Once this portion of beam 34 leaves the upper end of the insert 38, it propagates through the slurry 40, and impinges on the surface of the wafer 14. The wafer 14, as shown in detail in FIG. 5 has a substrate 50 made of silicon and an overlying oxide layer 52 (i.e. $SiO_2$).

The portion of the beam 34 which impinges on the wafer 14 will be partially reflected at the surface of the oxide layer 52 to form a first reflected beam 54. However, a portion of the light will also be transmitted through the oxide layer 52 to form a transmitted beam 56 which impinges on the underlying substrate 50. At least some of the light from the transmitted beam 56 reaching the substrate 50 will be reflected back through the oxide layer 52 to form a second reflected beam 58. The first and second reflected beams 54, 58 interfere with each other constructively or destructively depending on their phase relationship, to form a resultant beam 60, where the phase relationship is primarily a function of the thickness of the oxide layer 52.

Although, the above-described embodiment employs a silicon substrate with a single oxide layer, those skill in the art will recognize the interference process would also occur with other substrates and other oxide layers. The key is that the oxide layer partially reflects and partially transmits, and the substrate at least partially reflect, the impinging beam. In addition, the interference process may also be applicable to wafers with multiple layers overlying the substrate. Again, if each layer is partially reflective and partially transmissive, a resultant interference beam will be created, although it will be a combination of the reflected beams from all the layer and the substrate.

Referring again to FIG. 4, it can be seen the resultant beam 60 representing the combination of the first and second reflected beams 54, 58 (FIG. 5) propagates back through the slurry 40 and the insert 38, to the upper portion of the beam splitter 46. The beam splitter 46 diverts a portion of the resultant beam 60 towards the detector 48.

Figure 6:
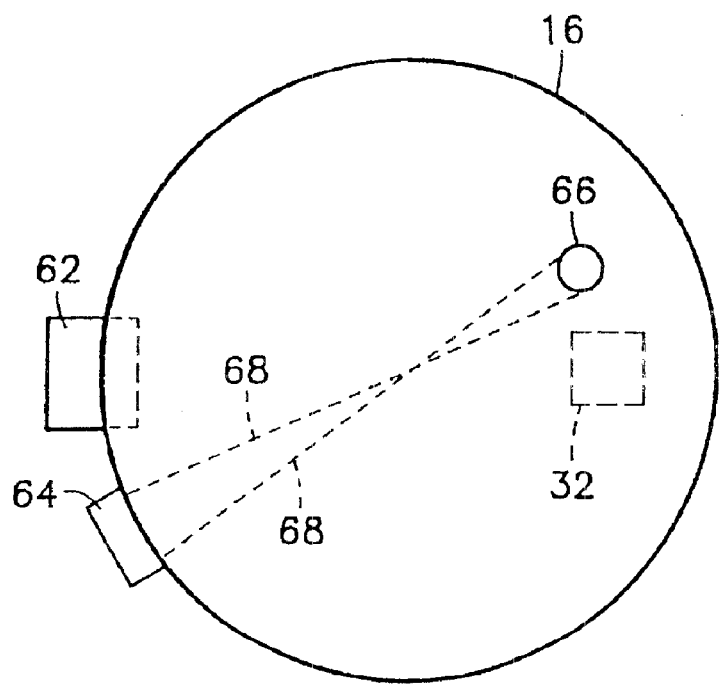
FIG. 6 is a simplified top view of the platen of the apparatus of FIG. 2, showing one possible relative arrangement between the window and sensor flag, and the sensor and laser interferometer.

The platen 16 will typically be rotating during the CMP process. Therefore, the platen hole 30 will only have a view of the wafer 14 during part of its rotation. Accordingly, the detection signal from the laser interferometer 32 should only be sampled when the wafer 14 is impinged by the laser beam 34. It is important that the detection signal not be sampled when the laser beam 34 is partially transmitted through the hole 30, as when a portion is blocked by the bottom of the platen 16 at the hole's edge, because this will cause considerable noise in the signal. To prevent this from happening, a position sensor apparatus has been incorporated. Any well known proximity sensor could be used, such as Hall effect, eddy current, optical interrupter, and acoustic sensor, although an optical interrupter type sensor was used in the tested embodiments of the invention and will be shown in the figures that follow. An apparatus accordingly to the present invention for synchronizing the laser interferometer 32 is shown in FIG. 6, with an optical interrupter type sensor 62 (e.g. LED/photodiode pair) mounted on a fixed point on the chassis of the CMP device such that it has a view of the peripheral edge of the platen 16. This type of sensor 62 is activated when an optical beam it generates is interrupted. A position sensor flag 64 is attached to the periphery of the platen 16. The point of attachment and length of the flag 64 is made such that it interrupts the sensor's optical signal only when the laser beam 34 from the laser interferometer 32 is completely transmitted through the previously-described window structure 66. For example, as shown in FIG. 6, the sensor 62 could be mounted diametrically opposite the laser interferometer 32 in relation to the center of the platen 16. The flag 64 would be attached to the platen 16 in a position diametrically opposite the window structure 66. The length of the flag 64 would be approximately defined by the dotted lines 68, although, the exact length of the flag 64 would be fine tuned to ensure the laser beam is completely unblocked by the platen 16 during the entire time the flag 64 is sensed by the sensor 62. This fine tuning would compensate for any position sensor noise or inaccuracy, the responsiveness of the laser interferometer 32, etc. Once the sensor 62 has been activated, a signal is generated which is used to determine when the detector signal from the interferometer 32 is to be sampled.

Data acquisition systems capable of using the position sensor signal to sample the laser interferometer signal during those times when the wafer is visible to the laser beam, are well known in the art and do not form a novel part of the present invention. Accordingly, a detailed description will not be given herein. However some considerations should be taken into account in choosing an appropriate system. For example, it is preferred that the signal from the interferometer be integrated over a period of time. This integration improves the signal-to-noise ratio by averaging the high frequency noise over the integration period. This noise has various causes, such as vibration from the rotation of the platen and wafer, and variations in the surface of the wafer due to unequal planarization. In the apparatus described above the diameter of the quartz window, and the speed of rotation of the platen, will determine how long a period of time is available during any one rotation of the platen to integrate the signal. However, under some circumstances, this available time may not be adequate. For instance, an acceptable signal-to-noise ratio might require a longer integration time, or the interface circuitry employed in a chosen data acquisition system may require a minimum integration time which exceeds that which is available in one pass.

Figure 7:
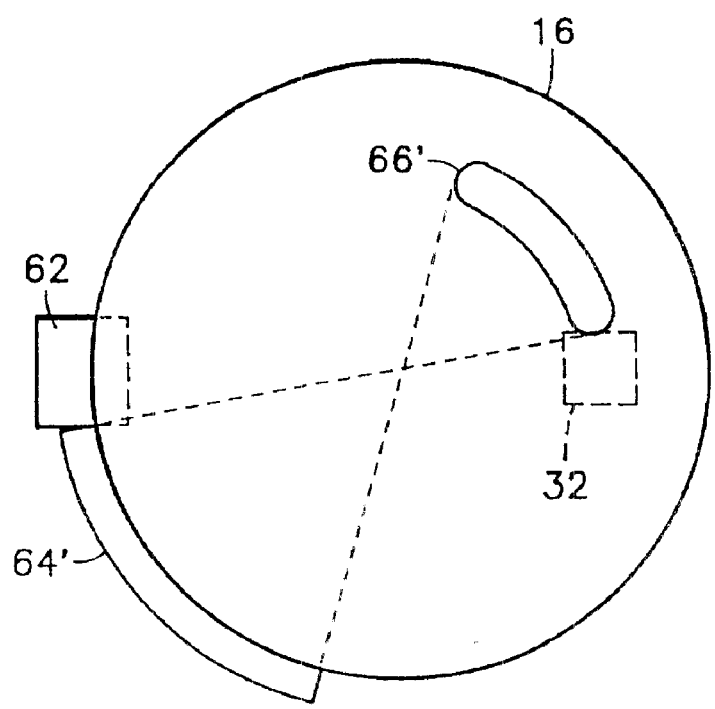
FIG. 7 is a top view of the platen of the apparatus of FIG. 2, showing a relative arrangement between the window and sensor flag, and the sensor and laser, where the window is in the shape of an arc.

One solution to this problem is to extend the platen hole along the direction of rotation of the platen. In other words, the window structure 66' (i.e. insert, pad, or plug) would take on the shape of an arc, as shown in FIG. 7. Of course, the flag 64' is expanded to accommodate the longer window structure 66'. Alternately, the window could remain the same, but the laser interferometer would be mounted to the rotating platen directly below the window. In this case, the CMP apparatus would have to be modified to accommodate the interferometer below the platen, and provisions would have to be made route the detector signal from the interferometer. However, the net result of either method would be to lengthen the data acquisition time for each revolution of the platen.

Although lengthening the platen hole and window is advantageous, it does somewhat reduce the surface area of the platen pad. Therefore, the rate of planarization is decreased in the areas of the disk which overlie the window during a portion of the platen's rotation. In addition, the length of the platen hole and window must not extend beyond the edges of the wafer, and the data sampling must not be done when the window is beyond the edge of the wafer, regardless of the wafer's translational position. Therefore, the length of the expanded platen hole and window, or the time which the platen-mounted interferometer can be sampled, is limited by any translational movement of the polishing head.

Figure 8:
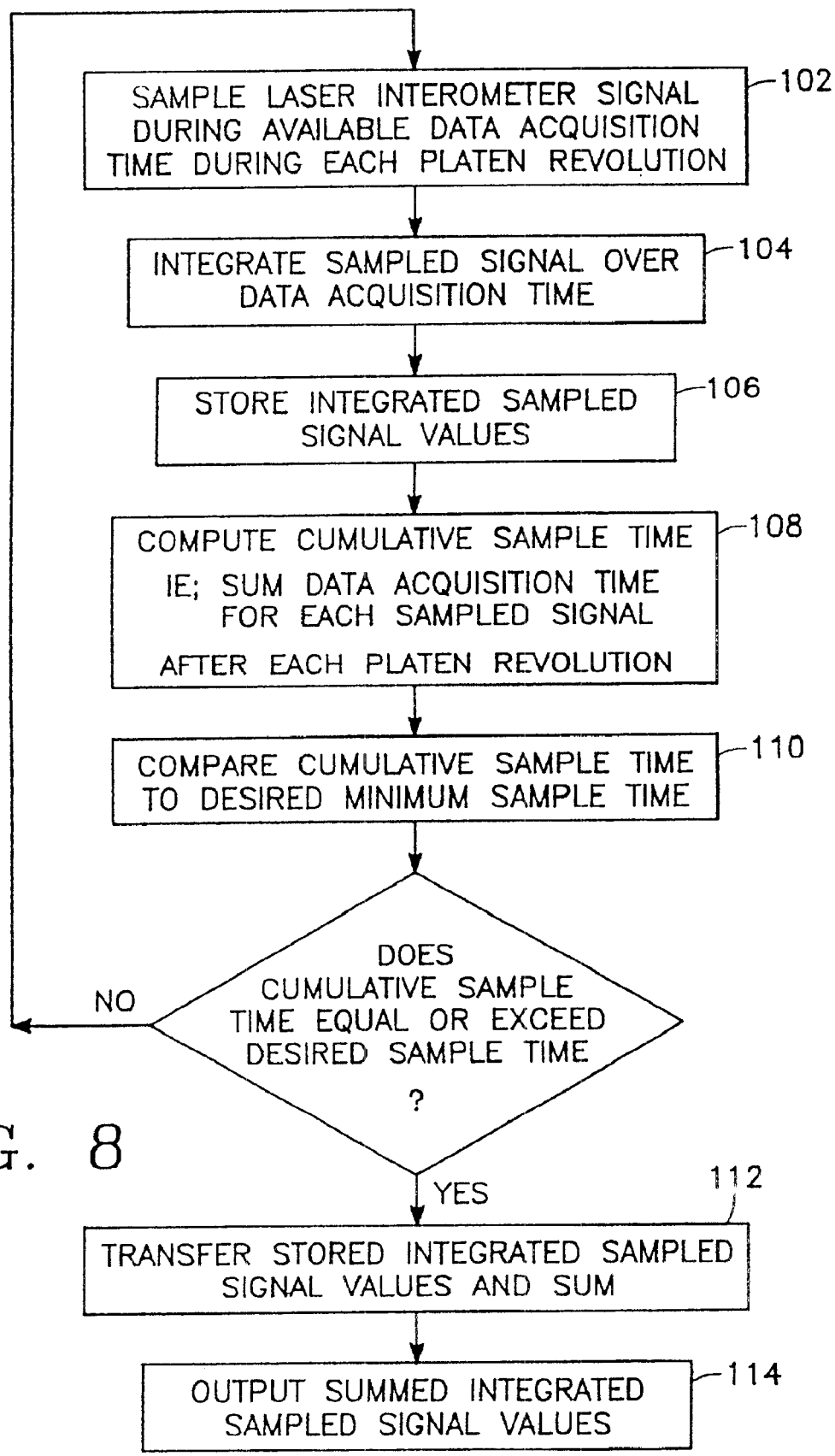
FIG. 8 is a block diagram of a method of piece-wise data acquisition in accordance with the present invention.

Accordingly, a more preferred method of obtaining adequate data acquisition integration time is to collect the data over more than one revolution of the platen. In reference to FIG. 8, during step 102, the laser interferometer signal is sampled during the available data acquisition time in each rotation of the platen. Next, in steps 104 and 106, each sampled signal is integrated over the aforementioned data acquisition time, and the integrated values are stored. Then, in steps 108 and 110, a cumulative sample time is computed after each complete revolution of the platen and compared to a desired minimum sample time. Of course, this would constitute only one sample time if only one sample has been taken. If the cumulative sample time equals or exceeds the desired minimum sample time, then the stored integrated values are transferred and summed, as shown in step 112. If not, the process of sampling, integrating, storing, computing the cumulative sample time, and comparing it to the desired minimum sample time continues. In a final step 114, the summed integrated values created each time the stored integrated values are transferred and summed, are output as a data signal. The just-described data collection method can be implemented in a number of well known ways, employing either logic circuits or software algorithms. As these methods are well known, any detailed description would be redundant and so has been omitted. It is noted that the method of piece-wise data collection provides a solution to the problem of meeting a desired minimum sample time no matter what the diameter of the window or the speed of platen rotation. In fact, if the process is tied to the position sensor apparatus, the platen rotation speed could be varied and reliable data would still be obtained. Only the number of platen revolutions required to obtain the necessary data would change.

Figure 5:
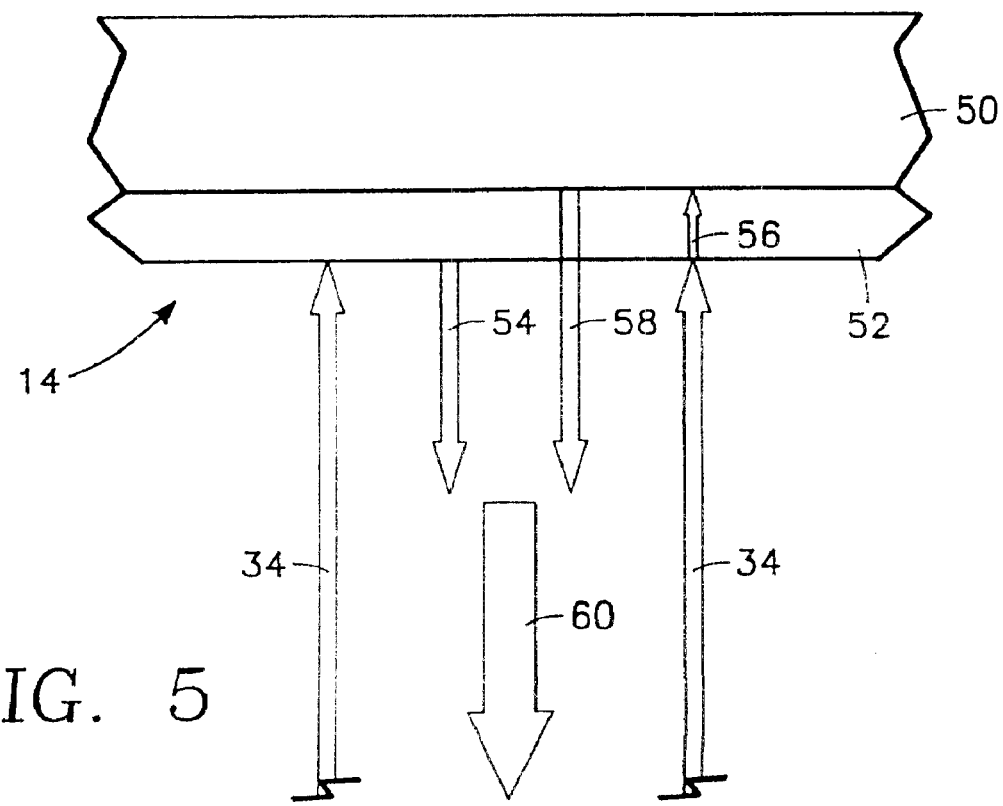
FIG. 5 is a simplified cross-sectional view of a blank oxide wafer being processed by the apparatus of FIG. 2, schematically showing the laser beam impinging on the wafer and reflection beams forming a resultant interference beam.
Figure 9A:
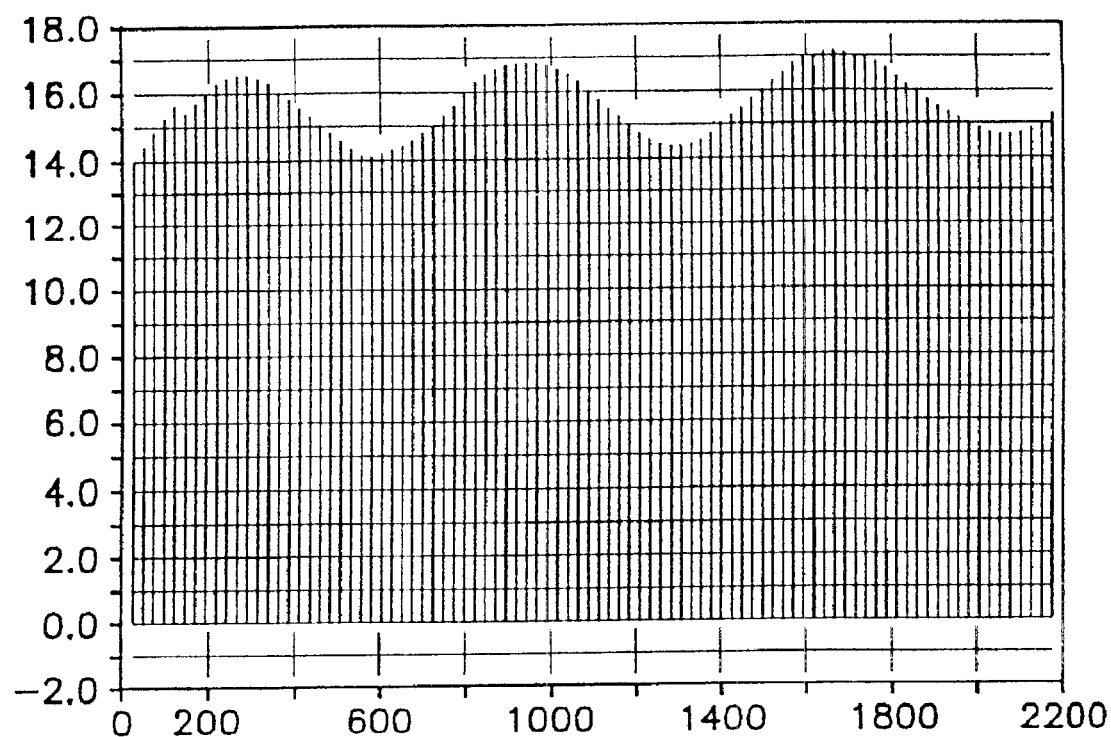
FIGS. 9A–B are graphs showing the cyclic variation in the data signal from the laser interferometer over time during the thinning of a blank oxide wafer. The graph of FIG. 9A shows the integrated values of the data signal integrated over a desired sample time, and the graph of FIG. 9B shows a filtered version of the integrated values.
Figure 9B:
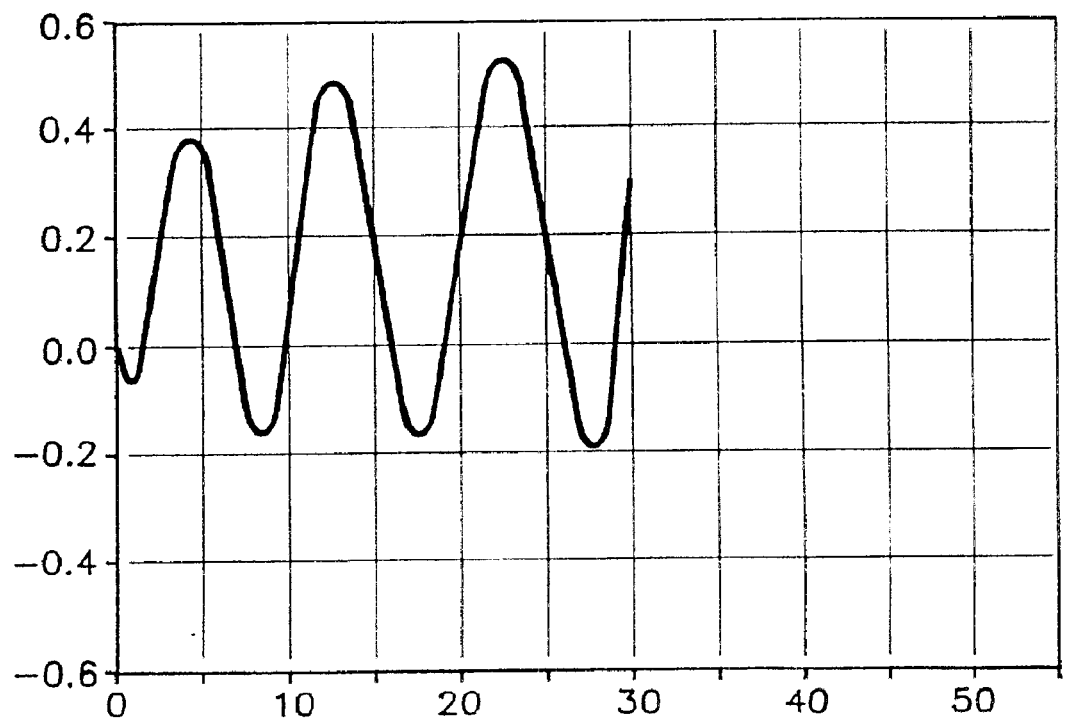
Figure 10A:
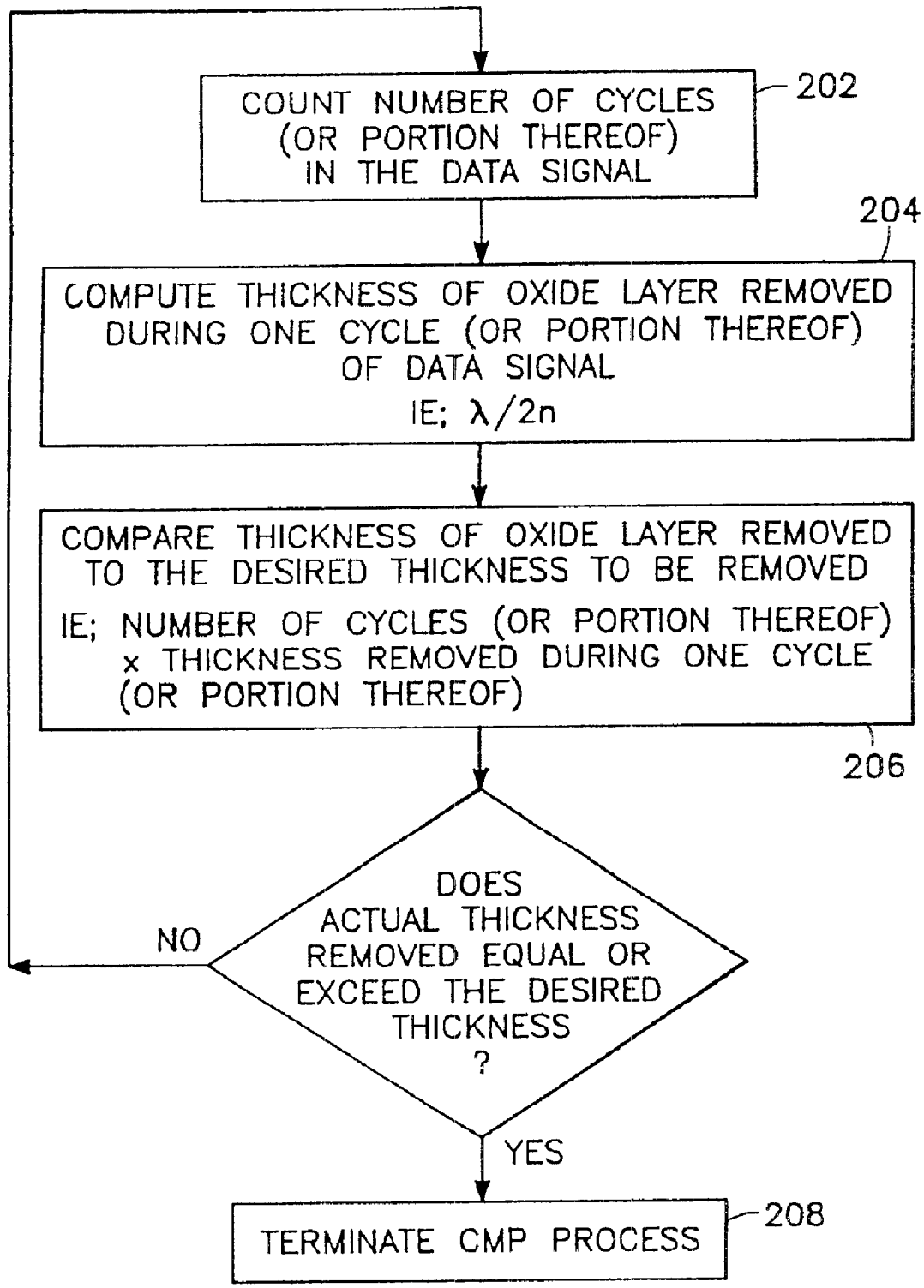
FIG. 10A is a block diagram of a backward-looking method of determining the endpoint of a CMP process to thin the oxide layer of a blank oxide wafer in accordance with the present invention.

The aforementioned first and second reflected beams which formed the resultant beam 60, as shown in FIGS. 4 and 5, cause interference to be seen at the detector 48. If the first and second beams are in phase with each other, they cause a maxima on detector 48. Whereas, if the beams are 180 degrees out of phase, they cause a minima on the detector 48. Any other phase relationship between the reflected beams will result in an interference signal between is the maxima and minima being seen by the detector 48. The result is a signal output from the detector 48 that cyclically varies with the thickness of the oxide layer 52, as it is reduced during the CMP process. In fact, it has been observed that the signal output from the detector 48 will vary in a sinusoidal-like manner, as shown in the graphs of FIGS. 9A–B. The graph of FIG. 9A shows the integrated amplitude of the detector signal (y-axis) over each sample period versus time (x-axis). This data was obtained by monitoring the laser interferometer output of the apparatus of FIG. 4, while performing the CMP procedure on a wafer having a smooth oxide layer overlying a silicon substrate (i.e. a blank oxide wafer). The graph of FIG. 9B represents a filtered version of the data from the graph of FIG. 9A. This filtered version shows the cyclical variation in the interferometer output signal quite clearly. It should be noted that the period of the interference signal is controlled by the rate at which material is removed from the oxide layer during the CMP process. Thus, factors such as the downward force placed on the wafer against the platen pad, and the relative velocity between the platen and the wafer determine the period. During each period of the output signal plotted in FIGS. 9A–B, a certain thickness of the oxide layer is removed. The thickness removed is proportional to the wavelength of the laser beam and the index of refraction of the oxide layer. Specifically, the amount of thickness removed per period is approximately $\lambda/2n$, where $\lambda$ is the freespace wavelength of the laser beam and n is the index of refraction of the oxide layer. Thus, it is possible to determine how much of the oxide layer is removed, in-situ, during the CMP process using the method illustrated in FIG. 10A. First, in step 202, the number of cycles exhibited by the data signal are counted. Next, in step 204, the thickness of the material removed during one cycle of the output signal is computed from the wavelength of the laser beam and the index of refraction of the oxide layer of the wafer. Then, the desired thickness of material to be removed from the oxide layer is compared to the actual thickness removed, in step 206. The actual thickness removed equals the product of the number of cycles exhibited by the data signal and the thickness of material removed during one cycle. In the final step 208, the CMP process is terminated whenever the removed thickness equals or exceeds the desired thickness of material to be removed.

Alternately, less than an entire cycle might be used to determine the amount of material removed. In this way any excess material removed over the desired amount can be minimized. As shown in the bracketed portions of the step 202 in FIG. 10A, the number of occurrences of a prescribed portion of a cycle are counted in each iteration. For example, each occurrence of a maxima (i.e. peak) and minima (i.e. valley), or vice versa, would constitute the prescribed portion of the cycle. This particular portion of the cycle is convenient as maxima and minima are readily detectable via well know signal processing methods. Next, in step 204, after determining how much material is removed during a cycle, this thickness is multiplied by the fraction of a cycle that the aforementioned prescribed portion represents. For example in the case of counting the occurrence of a maxima and minima, which represents one-half of a cycle, the computed one-cycle thickness would be multiplied by one-half to obtain the thickness of the oxide layer removed during the prescribed portion of the cycle. The remaining steps in the method remain unchanged. The net result of this alternate approach is that the CMP process can be terminated after the occurrence of a portion of the cycle. Accordingly, any excess material removed will, in most cases, be less than it would have been if a full cycle where is as the basis for determining the amount of material removed.

Figure 10B:
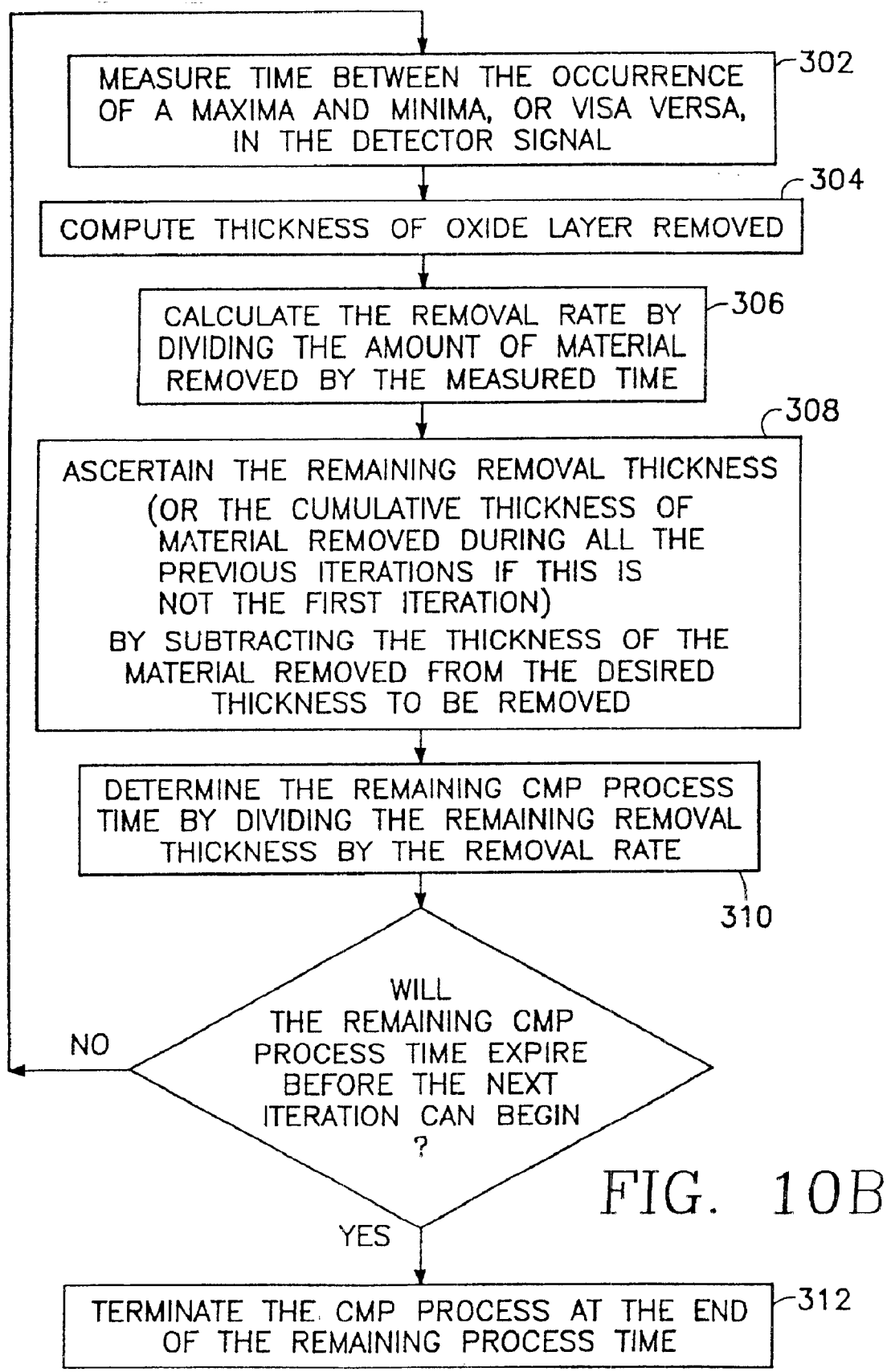
FIG. 10B is a block diagram of a forward-looking method of determining the endpoint of a CMP process to thin the oxide layer of a blank oxide wafer in accordance with the present invention.

The just-described methods look back from the end of a cycle, or portion thereof, to determine if the desired amount of material has been removed. However, as inferred above, the amount of material removed might exceed the desired amount. In some applications, this excess removal of material might be unacceptable. In these cases, an alternate method can be employed which looks forward and anticipates how much material will be removed over an upcoming period of time and terminates the procedure when the desired thickness is anticipated to have been removed. A preferred embodiment of this alternate method is illustrated in FIG. 10B. As can be seen, the first step 302 involves measuring the time between the first occurrence of a maxima and minima, or vice versa, in the detector signal (although an entire cycle or any portion thereof could have been employed). Next, in step 304, the amount of material removed during that portion of the cycle is determined via the previously described methods. A removal rate is then calculated by dividing the amount of material removed by the measured time, as shown in step 306. This constitutes the rate at which material was removed In the preceding portion of the cycle. In the next step 308, the thickness of the material removed as calculated in step 304 is subtracted from the desired thickness to be removed to determine a remaining removal thickness. Then, in step 310, this remaining removal thickness is divided by the aforementioned removal rate to determine how much longer the CMP process is to be continued before it termination.

It must be noted, however, that the period of the detector signal, and so the removal rate, will typically vary as the CMP process progresses. Therefore, the above-described method is repeated to compensate. In other words, once a remaining time has been calculated, the process is repeated for each occurrence of a maxima and minima, or vice versa. Accordingly, the time between the next occurring maxima and minima is measured, the thickness of material removed during the portion of the cycle represented by this occurrence of the maxima and minima (i.e. one-half) is divided by the measured time, and the removal rate is calculated, just as in the first iteration of the method. However, in the next step 308, as shown in brackets, the total amount of material removed during all the previous iterations is determined before being subtracted at from the desired thickness. The rest of the method remains the same in that the remaining thickness to be removed is divided by the newly calculated removal rate to determine the remaining CMP process time. In this way the remaining process time is recalculated after each occurrence of the prescribed portion of a cycle of the detector signal. This process continues until the remaining CMP process time will expire before the next iteration can begin. At that point the CMP process is terminated, as seen in step 312. Typically, the thickness to be removed will not be accomplished in the first one-half cycle of the detector signal, and any variation in the removal rate after being calculated for the preceding one-half cycle will be small. Accordingly, it is believe this forward-looking method will provide a very accurate way of removing just the desired thickness from the wafer.

Figure 11A:
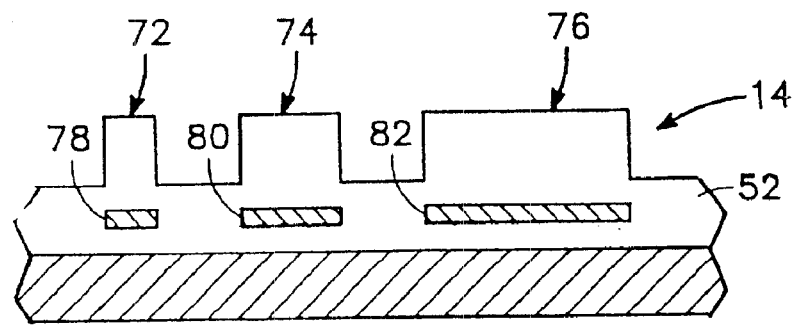
Figure 11B:
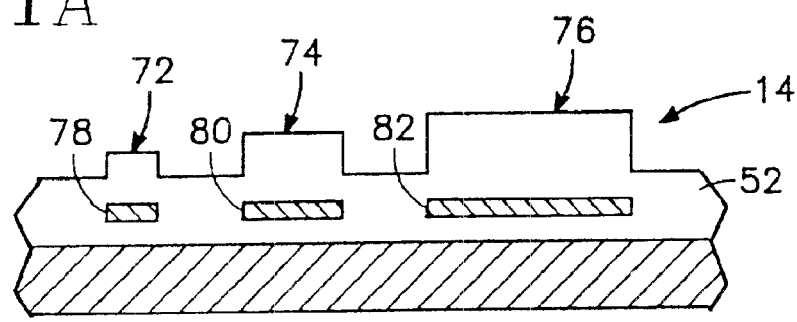
Figure 11C:
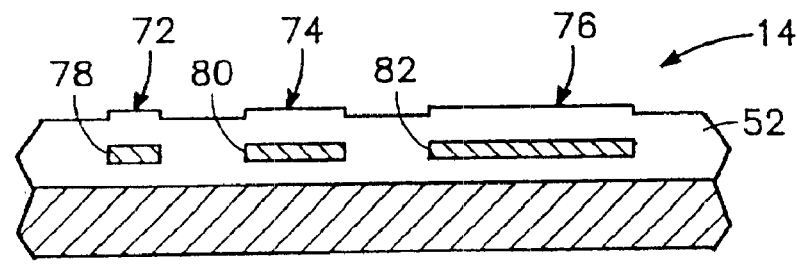

While the just-described monitoring procedure works well for the smooth-surfaced blank oxide wafers being thinned, it has been found that the procedure cannot be successfully used to planarize most patterned wafers where the surface topography is highly irregular. The reason for this is that a typical patterned wafer contains dies which exhibit a wide variety of differently sized surface features. These differently sized surface features tend to polish at different rates. For example, a smaller surface feature located relatively far from other features tends to be reduced faster than other larger features. FIGS. 11A–C exemplify a set of surface features 72, 74, 76 of the oxide layer 52 associated with underlying structures 78, 80, 82, that might be found on a typical patterned wafer 14, and the changes they undergo during the CMP process. Feature 72 is a relatively small feature, feature 74 is a medium sized feature, and feature 76 is a relatively large feature. FIG. 11A shows the features 72, 74, 76 before polishing, FIG. 11B shows the features 72, 74, 76 about midway through the polishing process, and FIG. 11C shows the features 72, 74, 76 towards the end of the polishing process. In FIG. 11A, the smaller feature 72 will be reduced at a faster rate than either the medium or large features 74, 76. In addition, the medium feature 74 will be reduced at a faster rate than the large feature 76. The rate at which the features 72, 74, 76 are reduced also decreases as the polishing process progresses. For example, the smaller feature 72 will initially have a high rate of reduction, but this rate will drop off during the polishing process. Accordingly, FIG. 11B shows the height of the features 72, 74, 76 starting to even out, and FIG. 11C shows the height of the features 72, 74, 76 essentially even. Since the differently sized features are reduced at different rates and these rates are changing, the interference signal produced from each feature will have a different phase and frequency. Accordingly, the resultant interference signal, which is partially made up of all the individual reflections from each of the features 72, 74, 76, will fluctuate in a seemingly random fashion, rather than the previously described periodic sinusoidal signal.

Figure 12:
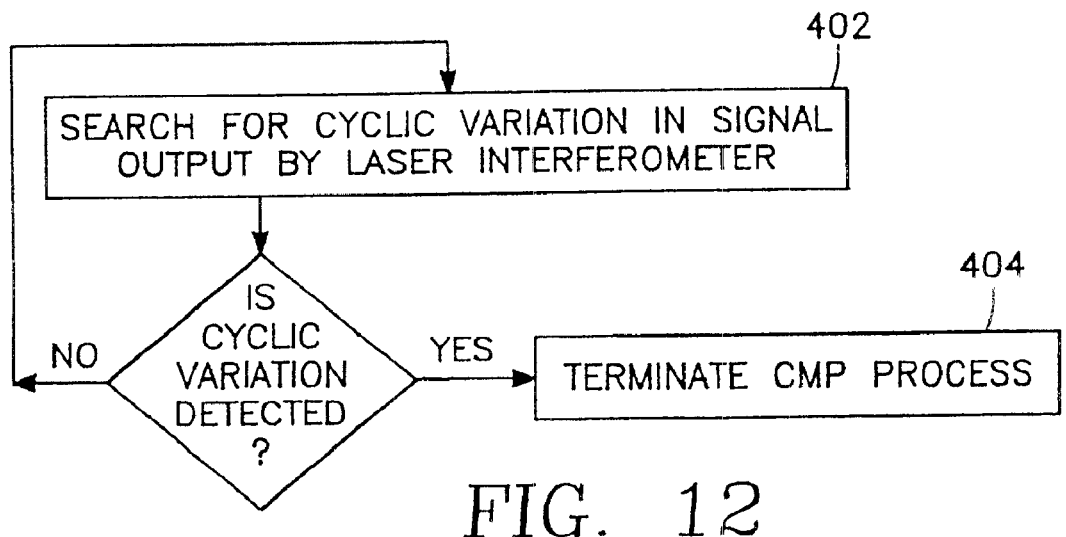
FIG. 12 is a block diagram of a method of determining the endpoint of a CMP process to planarize a patterned wafer with an irregular surface in accordance with the present invention.

However, as alluded to above, the polishing rates of the features 72, 74, 76 tend to converge closer to the point of planarization. Therefore, the difference in phase and frequency between the interference beams produced by the features 72, 74, 76 tend to approach zero. This results in the resultant interference signal becoming recognizable as a periodic sinusoidal wave form. Therefore it is possible to determine when the surface of a patterned wafer has become planarized by detecting when a sinusoidal interference signal begins. This method is illustrated in FIG. 12. First, in step 402, a search is made for the aforementioned sinusoidal variation in the interferometer signal. When the sinusoidal variation is discovered, the CMP procedure is terminated, as shown in step 404.

Figure 13:
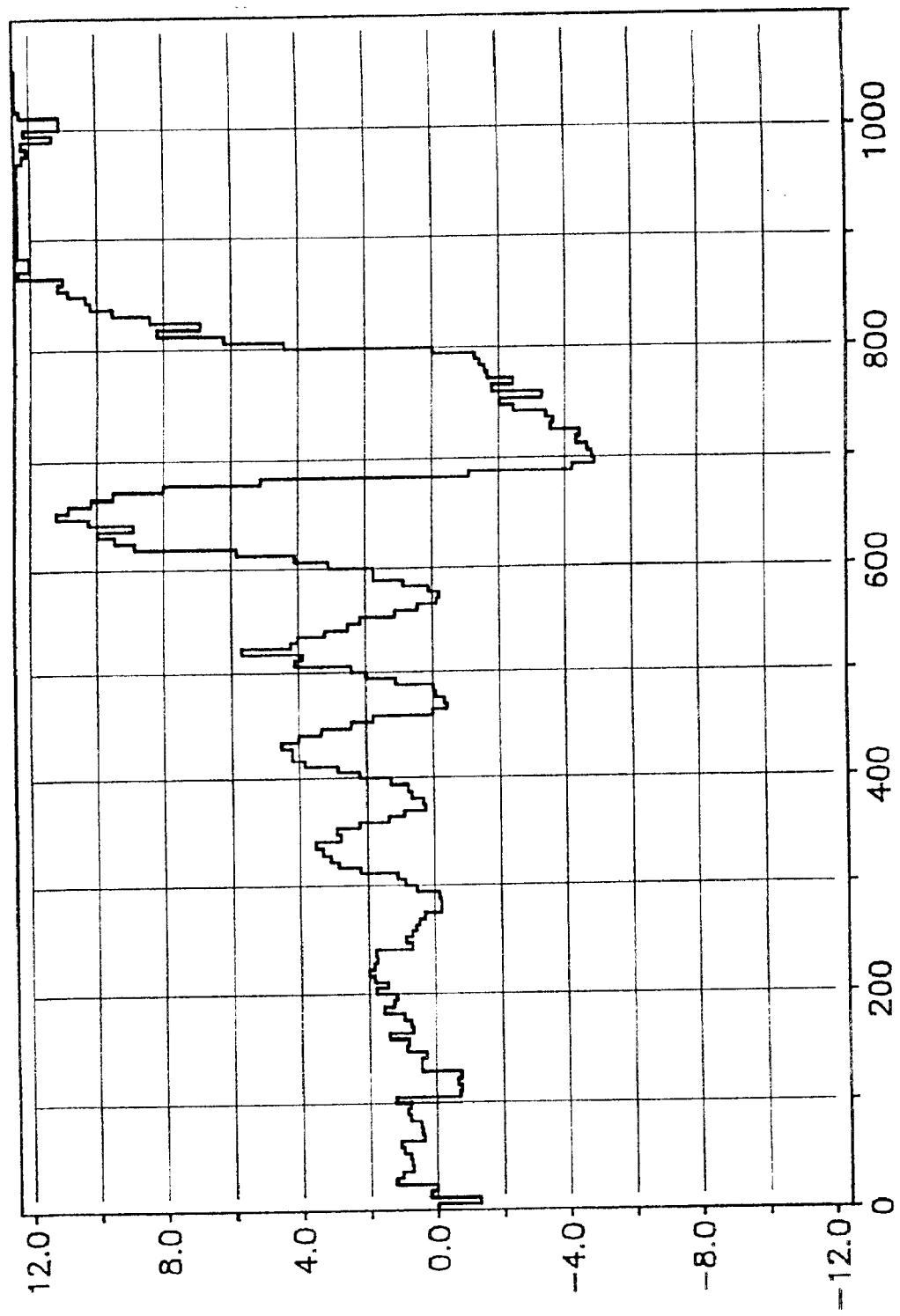
FIG. 13 is a graph showing variation in the data signal from the laser interferometer over time during the planarization of a patterned wafer.

FIG. 13 is a graph plotting the amplitude of the detector signal over time for a patterned wafer undergoing a CMP procedure. The sampled data used to construct this graph was held at its previous integrated value until the next value was reported, thus explaining the squared-off peak values shown. A close inspection shows that a discernible sinusoidal cycle begins to emerge at approximately 250 seconds. This coincides with the point where the patterned wafer first became planarized. Of course, in real-time monitoring of the interferometer's output signal, it would be impossible to know exactly when the cycling begins. Rather, at least some portion of the cycle must have occurred before it can be certain that the cycling has begun. Preferably, no more than one cycle is allowed to pass before the CMP procedure is terminated. A one-cycle limit is a practical choice because it provides a high confidence that the cycling has actually begun, rather than the signal simply representing variations in the noise caused by the polishing of the differently sized features on the surface of the wafer. In addition, the one-cycle limit ensures only a small amount of material is removed from the surface of the wafer after it becomes planarized. It has been found that the degree of planarization is essentially the same after two cycles, as it was after one. Thus, allowing the CMP procedure to continue would only serve to remove more material from the surface of the wafer. Even though one cycle is preferred in the case where the CMP process is to be terminated once the patterned wafer becomes planarized, it is not intended that the present invention be limited to that timeframe. If the signal is particularly strong, it might be possible to obtain the same level of confidence after only a portion of a cycle. Alternately, if the signal is particularly weak, it may take more than one cycle to obtain the necessary confidence. The choice will depend on the characteristics of the system used. For instance, the size of the gap between the quartz window and the surface of the wafer will have an effect on signal strength, and so the decision on how many cycles to wait before terminating the CMP process.

The actual determination as to when the output signal from the laser interferometer is actually cycling, and so indicating that the surface of the wafer has been planarized can be done in a variety of ways. For example, the signal could be digitally processed and an algorithm employed to make the aforementioned determination. Such a method is disclosed in U.S. Pat. No. 5,097,430, where the slope of the signal is used to make the determination. In addition, various well known curve fitting algorithms are available. These methods would essentially be used to compare the interferometer signal to a sinusoidal curve. When a match occurs within some predetermined tolerance, it is determined that the cycling has begun.

Some semiconductor applications require that the thickness of the material overlying a structure formed on a die of a patterned wafer (i.e. the film thickness) be at a certain depth, and that this film thickness be repeatable from die to die, and from wafer to wafer. The previously described methods for planarizing a typical patterned wafer will not necessarily produce this desired repeatable film thickness. The purpose of the planarization methods is to create a smooth and flat surface, not to produce a particular film thickness. Accordingly, if it is desirable to control the film thickness over a specific structure, or group of similarly sized structures, an alternate method must be employed. This alternate method is described below.

As alluded to previously, each differently sized surface feature resulting from a layer of oxide being formed over a patterned structure on a die tends to produce a reflected interference signal with a unique frequency and phase. It is only close to the point of planarization that the frequency and phase of each differently sized feature converges. Prior to this convergence the unique frequency and phase of the interference signals caused by the various differently sized features combine to produce a detector signal that seems to vary randomly. However, it is possible to process this signal to eliminate the interference signal contributions of all the features being polished at different rates, except a particularly sized feature, or group of similarly sized features. Once the interference signal associated with the particularly sized feature, or group of features, has been isolated, the methods discussed in association with the removal of material from a blank oxide disk are employed to remove just the amount of material necessary to obtain the desired film thickness.

Of course, the frequency of the interference signal component caused by the feature of interest must be determined prior to the signal processing. It is believed this frequency can be easily determined by performing a CMP process on a test specimen which includes dies exclusively patterned with structures corresponding to the structure which is to have a particular overlying film thickness. The detector signal produced during this CMP process is analyzed via well known methods to determine the unique frequency of the interference signal caused by the surface features associated with the aforementioned structures.

Figure 14:
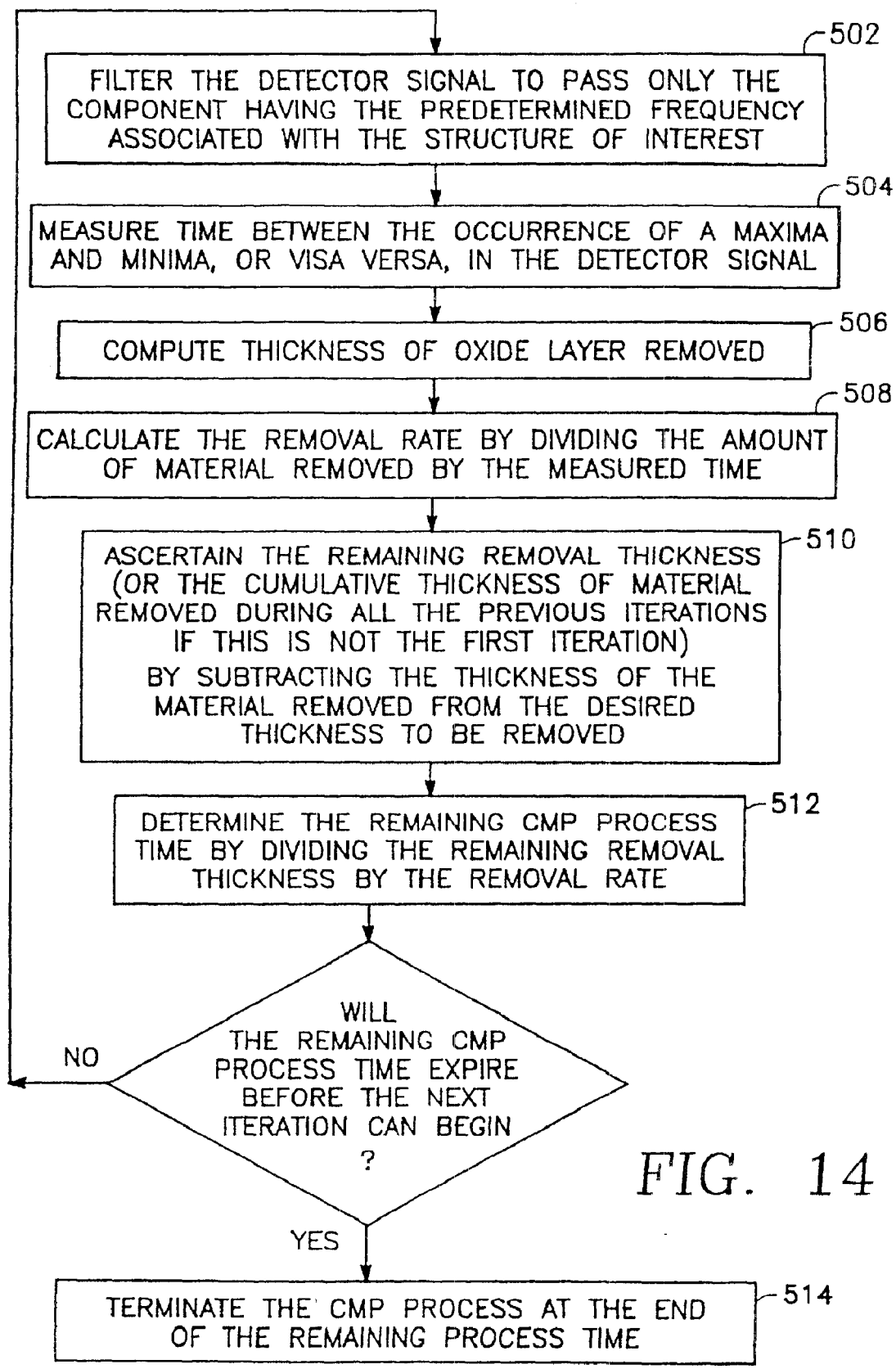
FIG. 14 is a block diagram of a method of determining the endpoint of a CMP process to control the film thickness overlying a particularly sized structure, or group of similarly sized structures, in accordance with the present invention.

The specific steps necessary to perform the above-described method of controlling the film thickness over a specific structure, or group of similarly sized structures on a die, in situ, during the CMP processing of a wafer, will now be described in reference to FIG. 14. In step 502, the detector signal is filtered to pass only the component of the signal having the predetermined frequency associated with the structure of interest. This step is accomplished using well known band pass filtering techniques. Next, in step 504 a measurement is made of the time between the first occurrence of a maxima and minima, or vice versa, in the detector signal (although an entire cycle or any portion thereof could have been employed). The amount of material removed during that portion of the cycle (i.e. one-half cycle) is determined in step 506 via previously described methods. Then, a removal rate is then calculated by dividing the amount of material removed by the measured time, as shown in step 508. This constitutes the rate at which material was removed in the preceding portion of the cycle. In the next step 510, the thickness of the material removed as calculated in step 506 is subtracted from the desired thickness to be removed (i.e. the thickness which when removed will result in the desired film thickness overlying the structure of interest), to determine a remaining removal thickness. Then, this remaining removal thickness is divided by the aforementioned removal rate to determine how much longer the CMP process is to be continued before it termination, in step 512. Once a remaining time has been calculated, the process is repeated for each occurrence of a maxima and minima, or vice versa. Accordingly, the time between the next occurring maxima and minima is measured, the thickness of material removed during the portion of the cycle represented by this occurrence of the maxima and minima (i.e. one-half) is divided by the measured time, and the removal rate is calculated, just as in the first iteration of the method. However, in the next step 510, as shown in brackets, the total amount of material removed during all the previous iterations is determined before being subtracted from the desired thickness. The rest of the method remains the same in that the remaining thickness to be removed is divided by the newly calculated removal rate to determine the remaining CMP process time. This process is repeated until the remaining time expires before the next iteration can begin. At that point, the CMP process is terminated, as seen in step 514.

It is noted that although the method for controlling film thickness described above utilizes the method for determining the CMP process endpoint illustrated in FIG. 10B, any of the other endpoint determination methods described herein could also be employed, if desired.

Figure 15A:
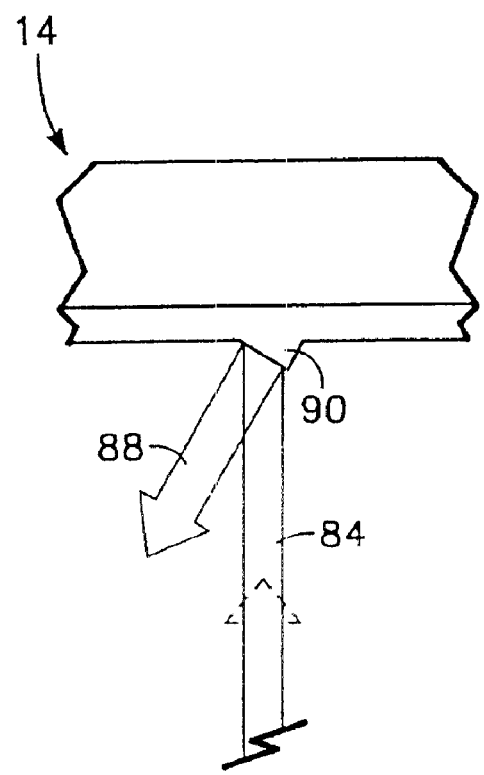
FIG. 15A is a simplified cross-sectional view of a wafer with a surface imperfection being illuminated by a wide-diameter laser beam.
Figure 15B:
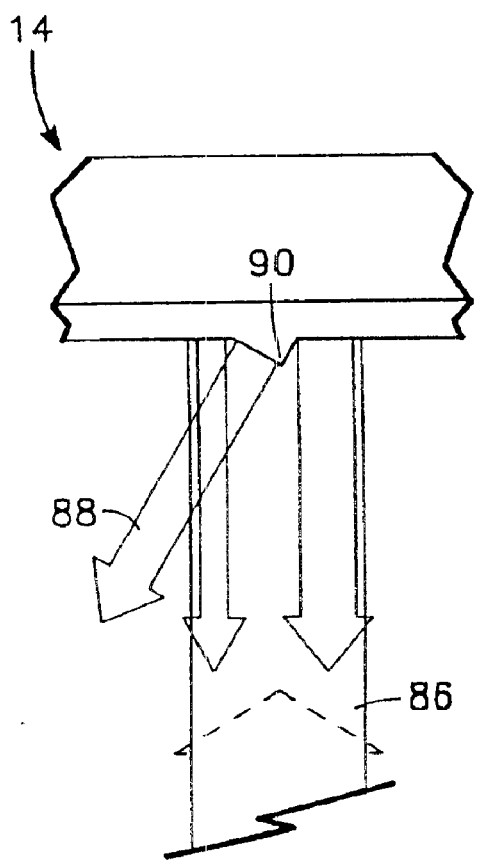
FIG. 15B is a simplified cross-sectional view of a wafer with a surface imperfection being illuminated by a wide-diameter laser beam.

It is further noted that the beam diameter (i.e. spot) and wavelength of the laser beam generated by the laser interferometer can be advantageously manipulated. As shown in FIGS. 15A and 15B, a narrow beam 84, such as one focused to the smallest spot possible for the wavelength employed, covers a smaller area of the surface of the wafer 14 than a wider, less focused beam 86. This narrow beam 84 is more susceptible to scattering (i.e. beam 88) due to surface irregularities 90, than the wider beam 86, since the wider beam 86 spreads out over more of the surface area of the wafer 14, and encompasses more of the surface irregularities 90. Therefore, a wider beam 86 would have an integrating effect and would be less susceptible to extreme variations in the reflected interference signal, as it travels across the surface of the wafer 14. Accordingly, a wider beam 86 is preferred for this reason. The laser beam with can be widened using well known optical devices.

It must also be pointed out that the wider beam will reduce the available data acquisition time per platen revolution since the time in which the beam is completely contained within the boundaries of the window is less than it would be with a narrower beam. However, with the previously described methods of data acquisition, this should not present a significant problem. In addition, since the wider beam also spreads the light energy out over a larger area than a narrower beam, the intensity of the reflections will be lessen somewhat. This drawback can be remedied by increasing the power of the laser beam from the laser interferometer so that the loss in intensity of the reflected beams is not a factor in detection.

As for the wavelength of the laser beam, it is feasible to employ a wavelength anywhere from the far infrared to ultraviolet. However, it is preferred that a beam in the red light range be used. The reason for this preference is two-fold. First, shorter wavelengths result in an increase in the amount of scattering caused by the chemical slurry because this scattering is proportional to the 4th power of the frequency of the laser beam. Therefore, the longer the wavelength, the less the scattering. However, longer wavelengths also result in more of the oxide layer being removed per period of the interference signal, because the amount of material removed per period equals approximately $\lambda/2n$. Therefore, the shorter the wavelength, the less material removed in one period. It is desirable to remove as little of the material as possible during each period so that the possibility of any excess material being removed is minimized. For example, in a system employing the previously described method by which the number of cycles, or a portion thereof, are counted to determine the thickness of the oxide layer removed, any excess material removed over the desired amount would be minimized if the amount of material removed during each cycle, or portion thereof, is as small as possible.

It is believed these two competing factors in the choice of wavelength are optimally balance if a red light laser beam is chosen. Red light offers an acceptable degree of scattering while not resulting in an unmanageable amount of material being removed per cycle.

While the invention has been described in detail by reference to the preferred embodiment described above, it is understood that variations and modifications thereof may be made without departing from the true spirit and scope of the invention.

Wherefore, what is claimed is:

1. An apparatus for chemical polishing (CMP) of a wafer, comprising:
   (a) a rotatable polishing platen to support a polishing pad, the platen having a hole formed therethrough and rotatably mounted to a chassis;
   (b) a polishing head for holding the wafer against the polishing pad and,
   (c) an endpoint detector, comprising,
      (c1) a stationary light source capable of generating a light beam directed towards the wafer from a side of the wafer contacting the polishing pad,
      (c2) a window disposed adjacent to the hole formed through the platen, the window rotating with the platen and intermittently providing a pathway for the light beam to impinge on the wafer during at least a part of a period of time when the wafer overlies the window, and
      (c3) a stationary detector to receive light from the light beam reflected by the wafer through the window.

2. The apparatus of claim 1, wherein the window comprises:
   an insert mounted within the hole in the platen, the insert being transmissive to the light beam.

3. The apparatus of claim 2, wherein an upper surface of the insert protrudes above a surface of the platen and extends away from the platen a distance such that a gap is formed between the upper surface of the insert and the wafer whenever the wafer is held against the polishing pad over the insert.

4. The apparatus of claim 3, wherein the gap between the wafer and the insert is no more than approximately 1 mm.

5. The apparatus of claim 4, wherein the gap between the wafer and the insert is 250 $\mu$m.

6. The apparatus of claim 1, wherein the window comprises a portion of the polishing pad, the portion being at least partially transmissive to the light beam.

7. The apparatus of claim 1, wherein the light source and detector provide an interfereometer.

8. The apparatus of claim 1, wherein the light source comprises a laser and the light beam is a laser beam.

9. A method for chemical mechanical polishing (CMP) of a wafer, the method comprising the steps of:
   (a) holding the wafer in a polishing head against a polishing pad;

(b) moving the polishing pad to polish the wafer;
(c) determining an endpoint whereat polishing is terminated, the determining step comprising the steps of,
(c1) generating a stationary light beam directed towards the wafer from a side of the wafer contacting the polishing pad;
(c2) intermittently passing the light beam through a window that moves with the polishing pad, the window intermittently providing a pathway for the light beam to impinge on the wafer during at least a part of a period of time when the wafer overlies the window, and,
(c3) detecting light of the light beam reflected from the wafer through the window to a stationary detector.

10. The method of claim 9, wherein the light source and detector provide an interfereometer.

11. The method of claim 9, wherein the step of generating a light beam comprises generating a laser beam.

12. The method of claim 9, further comprising holding the polishing pad with a polishing pad support.

13. The method of claim 12, wherein the polishing pad support comprises a rotatable platen.

14. The method of claim 13, wherein the window comprises a light-transmitting insert mounted in a hole through the platen.

15. The method of claim 12, wherein passing the light beam through the window comprises passing the light beam through a hole in the polishing pad support.

16. The method of claim 13, wherein the step of generating the laser beam comprises forming a beam diameter at a point of impingement on the wafer which is significantly greater than the smallest diameter possible for a wavelength of the laser beam.

17. The method of claim 9, wherein the polishing pad support comprises a metal portion and the window comprises a hole through the metal portion of the polishing pad support.

18. The method of claim 9, wherein the window comprises a light-transmitting portion of the polishing pad.

19. The method of claim 9, wherein the step of determining further comprises sensing when the window is adjacent the wafer such that the light beam can pass unblocked through the window and impinge on the wafer.

20. The method of claim 19, wherein:
(a) the step of detecting comprises producing a detection signal whenever light reflected from the wafer is detected;
(b) the step of sensing comprises outputting a sensing signal whenever the window is adjacent the wafer such that the light beam can pass unblocked through the window and impinge on the wafer; and,
(c) the step of determining further comprises a step of data acquisition, the data acquisition step comprising,
(c1) sampling the detection signal for the duration of the sensing signal, and,
(c2) outputting a data signal representing the sampled detection signal.

21. The method of claim 9, wherein the step of generating a laser beam comprises generating a laser beam having a wavelength in approximately the red light range.

22. An apparatus for chemical mechanical polishing (CMP) of a wafer, comprising:
(a) a polishing pad support to hold a polishing pad and cause the polishing pad to move relative to the wafer;
(b) a polishing head for holding the wafer against the polishing pad; and
(c) an optical monitoring system, comprising,
(c1) a stationary light source to direct a light beam toward the wafer from a side of the wafer contacting the polishing pad,
(c2) a window that moves with the polishing pad, the window intermittently providing a pathway for the light beam to impinge on the wafer during at least a part of a period of time when the wafer overlies the window,
(c3) a stationary detector to receive reflections of the light beam from the wafer through the window.

23. The apparatus of claim 22, wherein the polishing pad support comprises a rotatable platen.

24. The apparatus of claim 23, wherein the window comprises a light-transmitting insert mounted in a hole through the platen.

25. The apparatus of claim 22, wherein the polishing pad support comprises a metal portion and the window comprises a hole through the metal portion of the polishing pad support.

26. The apparatus of claim 25, further comprising a polishing pad disposed on the platen, and wherein the window comprises a light-transmitting portion of the polishing pad.

27. The apparatus of claim 22 wherein the optical monitoring system further comprises:
a position sensor for sensing when the window is adjacent the wafer such that the light beam generated by the light source can pass unblocked through the window and impinge on the wafer.

28. The apparatus of claim 27, wherein the position sensor comprises:
(a) a flag attached along a portion of a periphery of a platen rotatably mounted to a chassis, the flag extending radially outward from the platen; and
(b) an optical interrupter-type sensor mounted to the chassis at the periphery of the platen and capable of producing an optical beam which causes a signal to be generated for as long as the optical beam is interrupted by the flag; and wherein,
(c) the flag is attached to the periphery of the platen in a position such that the optical beam is interrupted by the flag while the light beam can pass unblocked through the window and impinge on the wafer.

29. An apparatus for chemical mechanical polishing (CMP) a wafer, said apparatus comprising;
a polishing pad support;
a polishing pad mounted on the polishing pad support, said polishing pad having at least a portion formed of a light-transmitting material;
a polishing head which during processing holds the wafer against the polishing pad; and
an optical monitoring system comprising a detector and a light source arranged to direct a light beam at least during part of the polishing operation through the light-transmitting material of said polishing pad so that the light beam impinges on the wafer and reflects back through the light-transmitting material to the detector and thereby provides for in-situ monitoring of the polishing process.

30. The apparatus of claim 29, wherein the light-transmitting material comprises polyurethane.

31. The apparatus of claim 29, wherein the light-transmitting material comprises a sheet.

32. The apparatus of claim 29, wherein the polishing pad comprises a polishing surface formed of opaque material, a bottom surface, and a window from the polishing surface to the bottom surface includes the light-transmitting material.

33. The apparatus of claim 32, wherein the light-transmitting material has a top surface substantially flush with the polishing surface.

34. The apparatus of claim 32, wherein the light transmitting material is positioned entirely between the polishing surface and the bottom surface.

35. The apparatus of claim 32, wherein the polishing pad includes a polishing layer including the light-transmitting material and a backing layer having an aperture aligned with the light-transmitting material.

36. The apparatus of claim 29, further comprising means for detecting a polishing endpoint from a signal generated by the optical monitoring system based on reflections of the light beam from the wafer sensed by the detector.

37. The apparatus of claim 36, wherein the laser beam has a wavelength in approximately the red light range.

38. The apparatus of claim 29, wherein the light source comprises a laser and the light beam comprises a laser beam.

39. The apparatus of claim 38, wherein the laser beam generated by the laser has a beam diameter at a point of impingement on the wafer which is significantly greater than the smallest diameter possible for a wavelength of the laser beam.

40. The apparatus of claim 29, wherein the polishing pad support has a hole formed therein, and the light-transmitting material is positioned over the hole.

41. The apparatus of claim 40, wherein the hole in the polishing pad support, and the window, are circular in shape.

42. The apparatus of claim 40, wherein the polishing pad support comprises a rotatable platen mounted to a chassis.

43. The apparatus of claim 42, wherein the hole in the platen, and the window, are arc-shaped having a radius with an origin coincident with a center of rotation of the platen.

44. The apparatus of claim 42, wherein the optical monitoring system further comprises a position sensor for sensing when the light-transmitting material is adjacent the wafer such that the light beam generated by the light source can pass unblocked through the light-transmitting material and impinge on the wafer.

45. The apparatus of claim 44, wherein the position sensor comprises:
(a) a flag attached along a portion of the periphery of the platen and extending radially outward therefrom; and,
(b) an optical interrupter-type sensor mounted to the chassis at the periphery of the platen and capable of producing an optical beam which causes a signal to be generated for as long as the optical beam is interrupted by the flag; and wherein,
(c) the flag is attached to the periphery of the platen in a position such that the optical beam is interrupted by the flag when the light beam can pass unblocked through the window and impinge on the wafer.

46. The apparatus of claim 44, wherein:
(a) the optical monitoring system comprises means for producing a detection signal whenever light reflected from the wafer is detected;
(b) the position sensor comprises means for outputting a sensing signal whenever the light-transmissive material is adjacent the wafer such that the light beam generated by the light source can pass unblocked through the light-transmissive material and impinge on the wafer; and,
(c) the optical monitoring system further comprises data acquisition means connected to the detector and position sensor for sampling the detection signal from the detector for the duration of the sensing signal from the position sensor, the data acquisition means comprising a means for outputting a data signal representing the sampled detection signal.

47. The apparatus of claim 29, wherein the optical monitoring system includes a data acquisition means that comprises:
(a) means for sampling a detection signal output from the detector;
(b) means for integrating the sampled detection signal over a predetermined period of time; and
(c) outputting means to output a data signal representing the integrated samples of the detection signal.

48. The apparatus of claim 29, further comprising data acquisition means for sampling a detection signal from the detector and a means for outputting a data signal representing the sampled detection signal.

49. The apparatus of claim 48, wherein the optical monitoring system includes a data acquisition means that comprises:
(a) means for sampling a detection signal output from the detector during each complete revolution of the platen, the detection signal being sampled in each complete revolution over a sample time;
(b) means for integrating each sample of the detection signal over the sample time to produce and integrated value corresponding to each sample;
(c) means for storing each integrated value;
(d) means for computing a cumulative sample time after each complete revolution of the platen, the cumulative sample time being the summation of the sample times associated with each sample of the detection signal;
(e) means for comparing the cumulative sample time to a desired minimum sample time; and
(f) means for transferring the stored integrated values from the storing means to means for calculating a summation thereof whenever the cumulative sample time equals or exceeds the predetermined minimum sample time; and,
(g) outputting means for outputting a data signal representing a series of the integrated value summations from the summation means.

50. The apparatus of claim 48, wherein the data signal output by the outputting means is cyclical, and wherein the apparatus further comprises an endpoint detector including:
(a) means for counting a number of cycles exhibited by the data signal;
(b) means for computing a thickness of material removed during one cycle of the data signal from the wavelength of the light beam and the index of refraction of an oxide layer of the wafer;
(c) means for comparing a desired thickness of material to be removed from the oxide layer, to a removed thickness comprising a product of the number of cycles exhibited by the data signal from the counting means and the thickness of material removed during one cycle from the computing means; and,
(d) means for terminating polishing whenever the removed thickness equals or exceeds the desired thickness of material to be removed.

51. The apparatus of claim 48, wherein the data signal output by the outputting means is cyclical, and wherein the apparatus further comprises an endpoint detector including:
(a) means for counting a number of occurrences of a portion of a cycle exhibited by the data signal;

(b) means for computing a thickness of material removed during the portion of the cycle of the data signal from the wavelength of the light beam and the index of refraction of an oxide layer of the wafer;

(c) means for comparing a desired thickness of material to be removed from the oxide layer, to a removed thickness comprising a product of the number of occurrences of the portion of the cycle exhibited by the data signal from the counting means and the thickness of material removed during the portion of the cycle from the computing means; and, (d) means for terminating polishing whenever the removed thickness equals or exceeds the desired thickness of material to be removed.

52. The apparatus of claim 48, wherein the data signal output by the outputting means is cyclical, and wherein the data signal output by the outputting means is cyclical, and wherein the apparatus further comprises an endpoint detector including:

(a) means for measuring the time required for the data signal to complete on of (i) a prescribed number of cycles, or (ii) a prescribed portion of one cycle, after each occurrence thereof;

(b) means for computing a thickness of material removed during the time measured by the measuring means from the wavelength of the light beam and the index of refraction of an oxide layer of the wafer;

(c) means for calculating a rate of removal, said calculating means dividing the thickness of material removed by the time measured obtained from the measuring means;

(d) means for ascertaining a remaining removal thickness, said ascertaining means subtracting a cumulative thickness of material removed from a desired thickness of material to be removed from the oxide layer, said cumulative thickness of material removed being provided by a means for summing the thickness of material removed computed by the computing means after each occurrence of the one of (i) a prescribed number of cycles, or (ii) a prescribed portion of one cycle;

(e) means for establishing a remaining CMP time, said establishing means dividing the remaining removal thickness by the rate of removal; and, (f) means for terminating polishing after the expiration of the remaining CMP time.

53. The apparatus of claim 48, wherein the wafer has an initially irregular surface topography and the data signal output by the outputting means is cyclical only after the wafer surface is planarized, and wherein the apparatus further comprises an endpoint detector including:

(a) means for detecting a cyclic variation in the data signal; and, (b) means for terminating polishing whenever the detecting means detects the cyclic variation in the data signal.

54. The apparatus of claim 53, wherein the detecting means is capable of detecting a cyclical variation in the data signal within at most one cycle of a beginning of the cyclical variation in the data signal.

55. The apparatus of claim 48, wherein the wafer has an initially irregular surface topography, and the data signal output by the outputting means is cyclical only after the wafer surface is planarized, and wherein the apparatus further comprises an endpoint detector including:

(a) means for filtering the data signal to pass only a component of the data signal having the predetermined frequency;

(b) means for counting a number of cycles exhibited by the filtered data signal;

(c) means for computing a thickness of material removed during one cycle of the filtered data signal from the wavelength of the light beam and the index of refraction of an oxide layer of the wafer;

(d) means for comparing a desired thickness of material to be removed from the oxide layer, to a removed thickness comprising a product of the number of cycles exhibited by the filtered data signal from the counting means and the thickness of material removed during one cycle from the computing means; and, (e) means for terminating the polishing whenever the removed thickness of material to be removed.

56. The apparatus of claim 48, wherein the wafer has an initially irregular surface topography, and the data signal output by the outputting means is cyclical only after the wafer surface is planarized, and wherein the apparatus further comprises an endpoint detector including:

(a) means for filtering the data signal to pass only a component of the data signal having the predetermined frequency;

(b) means for counting a number of occurrences of a portion of a cycle exhibited by the filtered data signal;

(c) means for computing a thickness of material removed during the portion of the cycle of the filtered data signal from the wavelength of the light beam and the index of refraction of an oxide layer of the wafer;

(d) means for comparing a desired thickness of material to be removed from the oxide layer, to a removed thickness comprising a product of the number of occurrences of the portion of the cycle exhibited by the filtered data signal from the counting means and the thickness of material removed during the portion of the cycle from the computing means; and, (e) means for terminating polishing whenever the removed thickness equals or exceeds the desired thickness of material to be removed.

57. The apparatus of claim 48, wherein the wafer has an initially irregular surface topography, and the data signal output by the outputting means is cyclical only after the wafer surface is planarized, and wherein the apparatus further comprises an endpoint detector including:

(a) means for filtering the data signal to pass only a component of the data signal having the predetermined frequency;

(b) means for measuring the time required for the filtered data signal to complete one of (i) a prescribed number of cycles, or (ii) a prescribed portion of one cycle, after each occurrence thereof;

(c) means for computing a thickness of material removed during the time measured by the measuring means from the wavelength of the light beam and the index of refraction of an oxide layer of the wafer;

(d) means for calculating a rate of removal, said calculating means dividing the thickness of material removed by the time measured obtained from the measuring means;

(e) means for ascertaining a remaining removal thickness, said ascertaining means subtracting a cumulative thickness of material removed from a desired thickness of material to be removed from the oxide layer, said cumulative thickness of material removed being provided by means for summing the thickness of material removed computed by the computing means after each occurrence of the one of (i) a prescribed number of cycles, or (ii) a prescribed portion of one cycle;

(f) means for establishing a remaining CMP time, said establishing means dividing the remaining removal thickness by the rate of removal; and, (g) means for terminating polishing after the expiration of the remaining CMP time.

58. The apparatus of claim 29, wherein the window light-transmitting material comprises a plug formed in the polishing pad.

59. A method for chemical mechanical polishing (CMP) a wafer on a polishing system, the method comprising the steps of:

holding a polishing pad with a polishing pad support, said polishing pad having at least a portion made of light-transmitting material;

holding the wafer on a polishing head against a polishing surface of the polishing pad;

polishing a surface layer on the wafer to remove an increasing amount thereof;

during at least a part of the polishing operation, directing a light beam through the light-transmitting material of the polishing pad so that the light beam impinges the wafer and reflects back through the light-transmitting material to an optical detector; and determining a point to end polishing based on a signal from the detector.

60. The method of claim 59, wherein the polishing pad support includes a hole formed therein, and the step of directing comprises directing the light beam through the hole.

61. The method of claim 59, wherein the step of polishing comprises rotating the polishing pad support and the polishing pad.

62. The method of claim 59, wherein the wafer comprises a semiconductor substrate.

63. The method of claim 62, wherein the wafer further comprises a surface layer on the substrate.

64. The method of claim 59, further comprising sampling a detection signal from the detector and outputting a data signal representing the sampled detection signal.

65. The method of claim 64, wherein the step of determining further comprises a step of data acquisition step that includes:

(a) integrating the sampled detection signal over a predetermined period of time; and wherein, (b) the step of outputting comprises outputting a data signal representing the integrated samples of the detection signal.

66. The method of claim 64, wherein the determining step further comprises a step of data acquisition step that includes:

(a) sampling the detection signal output during each complete revolution of a platen that supports the polishing pad, the detection signal being sampled in each complete revolution over a sample time;

(b) integrating each sample of the detection signal over the sample time to produce an integrated value corresponding to each sample;

(c) storing each integrated value;

(d) computing a cumulative sample time after each complete revolution of the platen, the cumulative sample time being the summation of the sample time associated with each sample of the detection signal;

(e) comparing the cumulative sample time to a desired minimum sample time; and (f) transferring the stored integrated values whenever the cumulative sample time equals or exceeds the predetermined minimum sample time, and calculating a summation thereof; and wherein, (g) the step of outputting comprises outputting a data signal representing a series of the integrated value summations.

67. The method of claim 64, wherein the data signal is cyclical, and wherein the step of determining further comprises:

(a) counting a number of cycles exhibited by the data signal;

(b) computing a thickness of material removed during one cycle of the data signal from a wavelength of the light beam and the index of refraction of an oxide layer of the wafer;

(c) comparing a desired thickness of material to be removed from the oxide layer, to a removed thickness comprising a product of the number of cycles exhibited by the data signal and the thickness of material removed during one cycle; and, (d) terminating polishing whenever the removed thickness equals or exceeds the desired thickness of material to be removed.

68. The method of claim 64, wherein the data signal is cyclical, and wherein the determining step further comprises the steps of:

(a) counting a number of occurrences of a portion of a cycle exhibited by the data signal;

(b) computing a thickness of material removed during the portion of the cycle of the data signal from a wavelength of the light beam and the index of refraction of an oxide layer of the wafer;

(c) comparing a desired thickness of material to be removed from the oxide layer, to a removed thickness comprising a product of the number occurrences of the portion of the cycle exhibited by the data signal and the thickness of material removed during the portion of the cycle; and, (d) terminating polishing whenever the removed thickness equals or exceeds the desired thickness of material to be removed.

69. The method of claim 64, wherein the data signal is cyclical, and wherein the step of determining step further comprises:

(a) measuring the time required for the data signal to complete one of (i) a prescribed number of cycles, or (ii) a prescribed portion of one cycle;

(b) computing a thickness of material removed during the time measured from a wavelength of the light beam and the index of refraction of an oxide layer of the wafer;

(c) calculating a rate of removal by dividing the thickness of material removed by the time measured;

(d) ascertaining a remaining removal thickness by subtracting the thickness of material to be removed from the oxide layer;

(e) establishing a remaining CMP time by dividing the remaining removal thickness by the rate of removal; and, (f) terminating the CMP after the expiration of the remaining CMP time.

70. The method of claim 69, wherein:

(a) steps (a) through (f) are repeated for each occurrence of the one of (i) a prescribed number of cycles, or (ii) a prescribed portion of one cycle;

(b) prior to step (d), the thickness of material removed after each occurrence of the one of (i) a prescribed number of cycles, or (ii) a prescribed portion of one cycle, is summed to produce a cumulative thickness of material removed; and, (c) the ascertaining step comprises ascertaining the remaining removal thickness by subtracting the cumulative thickness of material removed from the desired thickness of material to be removed from the oxide layer.

71. The method of claim 64, wherein the wafer has an initially irregular surface topography and the data signal is cyclical only after the wafer surface is planarized, and wherein the step of determining further comprises:

(a) searching for a cyclic variation in the data signal; and, (b) terminating polishing whenever the cyclic variation in the data signal is discovered.

72. The method of claim 71, wherein the step of terminating comprises terminating polishing within at most one cycle of a beginning of the cyclical variation in the data signal.

73. The method of claim 64, wherein the wafer has an initially irregular surface topography, and the data signal is cyclical only after the wafer surface is planarized, and wherein the step of determining further comprises:

(a) filtering the data signal to pass only a component of the data signal having the predetermined frequency;

(b) counting a number of cycles exhibited by the filtered data signal;

(c) computing a thickness of material removed during one cycle of the filtered data signal from a wavelength of the light beam and the index of refraction of an oxide layer of the wafer;

(d) comparing a desired thickness of material to be removed from the oxide layer, to a removed thickness comprising a product of the number of cycles exhibited by the filtered data signal and the thickness of material removed during one cycle; and, (e) terminating polishing whenever the removed thickness equals or exceeds the desired thickness of material to be removed.

74. The method of claim 64, wherein the wafer has an initially irregular surface topography, and the data signal is cyclical only after the wafer surface is planarized, and wherein the step of determining further comprises:

(a) filtering the data signal to pass only a component of the data signal having the predetermined frequency;

(b) counting a number of occurrences of a portion of a cycle exhibited by the filtered data signal;

(c) computing a thickness of material removed during the portion of the cycle of the filtered data signal from a wavelength of the light beam and the index of refraction of an oxide layer of the wafer;

(d) comparing a desired thickness of material to be removed from the oxide layer, to a removed thickness comprising a product of the number occurrences of the portion of the cycle exhibited by the filtered data signal and the thickness of material removed during the portion of the cycle; and, (e) terminating polishing whenever the removed thickness equals or exceeds the desired thickness of material to be removed.

75. The method of claim 64, wherein the wafer has an initially irregular surface topography, and the data signal is cyclical only after the wafer surface is planarized, and wherein the step of determining further comprises:

(a) filtering the data signal to pass only a component of the data signal having the predetermined frequency;

(b) measuring the time required for the filtered data signal to complete one of (i) a prescribed number of cycles, or (ii) a prescribed portion of one cycle;

(c) computing a thickness of material removed during the time measured from a wavelength of the light beam and the index of refraction of an oxide layer of the wafer;

(d) calculating a rate of removal by dividing the thickness of material removed by the time measured;

(e) ascertaining a remaining removal thickness by subtracting the thickness of material removed from a desired thickness of material to be removed from the oxide layer;

(f) establishing a remaining CMP time by dividing the remaining removal thickness by the rate of removal; and, (g) terminating polishing after the expiration of the remaining CMP time.

76. The method of claim 75, wherein:

(a) steps (b) through (f) are repeated for each occurrence of the one of (i) a prescribed number of cycles, or (ii) a prescribed portion of one cycle;

(b) prior to step (e), the thickness of material removed after each occurrence of the one of (i) a prescribed number of cycles, or (ii) a prescribed portion of one cycle, is summed to produce a cumulative thickness of material removed; and, (c) the ascertaining step comprises ascertaining the remaining removal thickness by subtracting the cumulative thickness of material removed from the desired thickness of material to be removed from the oxide layer.

* * * * *